United States Patent
Takai et al.

(10) Patent No.: US 7,629,045 B2
(45) Date of Patent: *Dec. 8, 2009

(54) ADHESION ASSISTING AGENT-BEARING METAL FOIL, PRINTED WIRING BOARD, AND PRODUCTION METHOD OF PRINTED WIRING BOARD

(75) Inventors: Kenji Takai, Oyama (JP); Norio Moriike, Shimodate (JP); Kenichi Kamiyama, Shimodate (JP); Takako Watanabe, Shimodate (JP); Shin Takanezawa, Shimodate (JP); Koji Morita, Mooka (JP); Katsuyuki Masuda, Shimodate (JP); Kiyoshi Hasegawa, Yuki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 25 days.

This patent is subject to a terminal disclaimer.

(21) Appl. No.: 11/044,533

(22) Filed: Jan. 28, 2005

(65) Prior Publication Data

US 2005/0202261 A1 Sep. 15, 2005

(30) Foreign Application Priority Data

Jan. 30, 2004 (JP) ............................... 2004-024456
Apr. 12, 2004 (JP) ............................... 2004-116726

(51) Int. Cl.
*B32B 3/00* (2006.01)
(52) U.S. Cl. ..................... 428/344; 428/606; 428/209
(58) Field of Classification Search ............... 428/209, 428/606, 344
See application file for complete search history.

(56) References Cited

U.S. PATENT DOCUMENTS

| | | | |
|---|---|---|---|
| 2,897,186 A | 7/1959 | Miller et al. | |
| 5,053,280 A | * 10/1991 | Takanezawa et al. | 428/413 |
| 5,366,814 A | * 11/1994 | Yamanishi et al. | 428/607 |
| 5,389,446 A | * 2/1995 | Yamanishi et al. | 428/472 |
| 5,419,946 A | * 5/1995 | Takanezawa et al. | 428/206 |
| 5,622,782 A | * 4/1997 | Poutasse et al. | 428/344 |
| 5,874,009 A | * 2/1999 | Inada et al. | 216/20 |
| 5,935,452 A | * 8/1999 | Inada et al. | 216/20 |

(Continued)

FOREIGN PATENT DOCUMENTS

| | | |
|---|---|---|
| CN | 1 106977 | 8/1995 |
| CN | 1358407 | 7/2002 |
| JP | 01-276789 | 11/1989 |
| JP | 04-182466 | 6/1992 |
| JP | 04-207097 | 7/1992 |

(Continued)

OTHER PUBLICATIONS

First Notification of Reasons for Rejection, issued Jul. 20, 2006, in connection with counterpart Taiwanese application.

(Continued)

*Primary Examiner*—Cathy Lam
(74) *Attorney, Agent, or Firm*—Antonelli, Terry, Stout & Kraus, LLP.

(57) ABSTRACT

The invention relates to an adhesion assisting agent-bearing metal foil comprising a layer of an adhesion assisting agent containing an epoxy resin as an indispensable component on a metal, wherein the adhesion assisting agent layer has a thickness of 0.1 to 10 μm. The invention also relates to a printed wiring board being a multilayer wiring board having a plurality of layers, wherein an adhesion assisting agent layer is formed between insulating layers.

19 Claims, 2 Drawing Sheets

U.S. PATENT DOCUMENTS

| | | | |
|---|---|---|---|
| 6,748,652 B2 * | 6/2004 | Andou et al. | 29/852 |
| 6,979,712 B2 * | 12/2005 | Takanezawa et al. | 525/109 |
| 2003/0180512 A1 | 9/2003 | Andou et al. | |

FOREIGN PATENT DOCUMENTS

| | | |
|---|---|---|
| JP | 05-057835 | 3/1993 |
| JP | 06-116517 | 4/1994 |
| JP | 06-148877 | 5/1994 |
| JP | 06-335992 | 12/1994 |
| JP | 07-221444 | 8/1995 |
| JP | 07-329246 | 12/1995 |
| JP | 09-199861 | 7/1997 |
| JP | 10-004254 | 1/1998 |
| JP | 10-242635 | 9/1998 |
| JP | 11-021419 | 1/1999 |
| JP | 11-074641 | 3/1999 |
| JP | 11-130831 | 5/1999 |
| JP | 11-214844 | 8/1999 |
| JP | 2000-256537 | 9/2000 |
| JP | 2002-003577 | 1/2002 |
| JP | 2002-012740 | 1/2002 |
| JP | 2002-084073 | 3/2002 |
| JP | 2002-137328 | 5/2002 |
| JP | 2002-226556 | 8/2002 |
| JP | 2003-158364 | 5/2003 |
| JP | 2003-198122 | 7/2003 |
| JP | 2003-229648 | 8/2003 |
| JP | 2003-264373 | 9/2003 |
| JP | 2004-014611 | 1/2004 |
| JP | 2004-025835 | 1/2004 |
| JP | 2004-047680 | 2/2004 |
| JP | 2004-250470 | 9/2004 |
| JP | 2005-053218 | 3/2005 |
| WO | WO 2005-009093 A1 | 1/2005 |

OTHER PUBLICATIONS

Korean Official Action, dated Aug. 16, 2006, for Korean Application No. 10-2005-7902.

Japanese Official Action (Notice of Reasons for Rejection) for Application No. 2004-116726, issued on Dec. 4, 2007.

Japanese Official Action issued Apr. 15, 2008, for Application No. 2004-024456.

Japanese Official Action issued Jun. 24, 2008, for Application No. 2004-116727.

Chinese Official Action issued Jan. 18, 2008, for Appl. No. 2005100051273.

Chinese Offical Action on Sep. 5, 2008, for Application No. 2005100051273.

Japanese Offical Action issued Feb. 3, 2009, for Application No. 2004-116726.

Taiwanese Official Action issued Apr. 19, 2009, for Application No. 95142602.

Partial Translation of the Japanese Official Action issued Feb. 3, 2009, for Application No. 2004-116726. (Partial Translation only, the JPOA was submitted with the Information Disclosure Statement filed Feb. 6, 2009.)

Chinese Official Action dated Apr. 24, 2009, for Application No. 2005100051273.

Japanese Official Action issued Jul. 28, 2009, for Application No. 2004-024456.

Taiwanese Official Action issued Jul. 22, 2009, for Application No. 09820445290.

* cited by examiner

US 7,629,045 B2

ADHESION ASSISTING AGENT-BEARING METAL FOIL, PRINTED WIRING BOARD, AND PRODUCTION METHOD OF PRINTED WIRING BOARD

BACKGROUND OF THE INVENTION

1. Field of the Invention

The invention relates to an adhesion assisting agent-bearing metal foil, a printed wiring board, and a production method of the printed wiring board. The invention also relates to a multilayer circuit board, a semiconductor chip-mounting substrate, and a semiconductor package substrate.

2. Description of the Related Art

Recently, electronic appliances have been required to be compact, lightweight and high speed, and high densification of printed wiring boards has advanced and in these years, therefore, production of a printed wiring board by a semi-additive method using electroplating has been drawing attention.

As a semi-additive method, Japanese Patent Application Laid-Open (JP-A) No. 10-4254 (application date: Jun. 14, 1996) discloses a method involving forming holes to be IVH in the resin surface in which a circuit is to be formed by laser; surface-roughening the resin surface with several μm by chemical roughening or plasma treatment; supplying a Pd catalyst; carrying out electroless plating in about 1 μm-thickness, forming a resist layer for pattern-wise electroplating, carrying out wiring formation by pattern-wise electroplating, and then removing the resist and power supply layer existing in the portion other than the circuit. According to this method, finer wiring formation is made possible as compared with a subtractive method with a high side etching degree. Further, JP-A No. 2003-158364 (application date: Nov. 22, 2001) discloses a separable metal foil with a thickness of 5 μm or thinner formed on a supporting metal foil. The method disclosed therein makes it possible to thin down the thickness of the metal foil. According to this method, since there is no need to carry out electroless plating on the surface of an insulating resin layer, a printed wiring board with a greater reliability can be produced.

However, according to these methods, the roughened shape adversely interferes with the fine wiring formation and also the electric properties are undesirably deteriorated due to the roughened shape.

JP-A No. 7-221444 (application date: Jan. 31, 1994) discloses a method involving forming a copper layer with about 1 μm thickness on one face of a polyimide film by using an electron beam evaporation apparatus and laminating the layer on an inner layer circuit through an adhesive or a prepreg to form an electric power supply layer. Also, JP-A No. 6-302965 . (application date: Apr. 16, 1993) discloses a method of forming an electric power supply layer on a dielectric layer by sputtering. It is possible to significantly lessen the degree of the roughened shape by forming the electric power supply layer by a dry process such as evaporation and sputtering, disclosed methods as compared with the conventional methods.

However, if the resin is made smooth in those methods, it becomes difficult to form a resin layer thereon. In other words, it becomes difficult to form a built-up layer on a core substrate or to form a solder resist on a substrate. Especially, if the insulating layer surface roughness Rz is 2.0 μm or less, the resin layer formation thereon becomes very hard, although it depends on the insulating layer. Even if laminating seems to be done, the substrate is very poor in resistance to moisture absorption and heat resistance in many cases. Particularly, in these years, low dielectric resin layers having no functional group have been used frequently for insulating layers and such a tendency has been more significant.

As described, wiring boards with an excellent fine wiring formation and electric properties and advantageous in terms of the production cost and having a high reliability and high frequency have not been made available so far.

SUMMARY OF THE INVENTION

The invention relates the following embodiments.

(1) An adhesion assisting agent-bearing metal foil comprising a layer of an adhesion assisting agent containing an epoxy resin as an indispensable component on a metal, wherein the adhesion assisting agent layer has a thickness of 0.1 to 10 μm.

(2) The adhesion assisting agent-bearing metal foil according to (1), wherein the resin containing an epoxy resin as an indispensable component contains (A) an epoxy resin, (B) rubber particles, and (C) an epoxy resin curing agent.

(3) The adhesion assisting agent-bearing metal foil according to (2), wherein the component (A) is a novolak epoxy resin or contains a novolak epoxy resin.

(4) The adhesion assisting agent-bearing metal foil according to (3), wherein the component (A) has a biphenyl structure.

(5) The adhesion assisting agent-bearing metal foil according to any one of (2) to (4), wherein the component (B) is crosslinked rubber particles.

(6) The adhesion assisting agent-bearing metal foil according to any one of (2) to (5), wherein the component (B) is at least one substance selected from acrylonitrile-butadiene rubber particles, carboxylic acid-modified acrylonitrile-butadiene rubber particles, and butadiene rubber-acrylic resin core shell particles.

(7) The adhesion assisting agent-bearing metal foil according to any one of (2) to (6), wherein the component (B) is added in an amount of 0.5 to 20 parts by weight to the component (A) 100 parts by weight.

(8) The adhesion assisting agent-bearing metal foil according to any one of (2) to (7), wherein the component (C) is novolak phenol resin.

(9) The adhesion assisting agent-bearing metal foil according to any one of (2) to (8), wherein the component (C) is a cresol novolak phenol resin having a triazine ring.

(10) The adhesion assisting agent-bearing metal foil according to any one of (2) to (9), wherein the surface of the metal foil has a ten-point average roughness Rz 2.0 μm or less.

(11) The adhesion assisting agent-bearing metal foil according to any one of (1) to (10), wherein the surface of the metal foil is not subjected to roughening treatment for promotion of the adhesive strength.

(12) The adhesion assisting agent-bearing metal foil according to any one of (1) to (11), wherein the metal foil is a copper foil subjected to rust preventing treatment with at least one of zinc, chromium, and nickel.

(13) The adhesion assisting agent-bearing metal foil according to any one of (1) to (12), wherein the surface of the metal foil is subjected to silane coupling treatment with a silane coupling agent.

(14) The adhesion assisting agent-bearing metal foil according to (13), wherein the silane coupling agent has an epoxy group or an amino group.

(15) The adhesion assisting agent-bearing metal foil according to any one of (1) to (14), wherein the metal foil has a thickness of 5 μm or thinner and has a separable carrier.

(16) A printed wiring board produced using the adhesion assisting agent-bearing metal foil according to any one of (1) to (15) and having a peeling strength of 0.6 kN/m or higher at 20° C. between an insulating layer formed through the adhesion assisting agent layer of the adhesion assisting agent-bearing metal foil and a conductor circuit with 1 mm width formed using the metal foil of the adhesion assisting agent-bearing metal foil.

(17) The printed wiring board according to (16), wherein the peeling strength is 0.4 kN/m or higher at 20° C. between the insulating layer and the conductor circuit after heating at 150° C. for 240 hours.

(18) A production method of a printed wiring board comprising: layering the adhesion assisting agent-bearing metal foil according to (15) on an insulating layer in such a manner that the adhesion assisting agent layer is set in the insulating layer side; forming holes for interlayer connection; carrying out electroless copper plating; forming a resist layer; forming a circuit by pattern-wise electroplating; and removing the resist layer and unneeded portions of an electric power supply layer by etching.

(19) The production method of a printed wiring board according to (18), wherein electroless gold plating is carried out in the outermost layer of the wiring.

(20) A printed wiring board being a multilayer wiring board having a plurality of layers, wherein an adhesion assisting agent layer is formed between insulating layers.

(21) A printed wiring board comprising solder resist in the outermost layer and an adhesion assisting agent layer between an insulating layer and solder resist.

(22) The printed wiring board according to (20) or (21), wherein the thickness of the adhesion assisting agent layer is in a range of 0.1 to 10 μm.

(23) The printed wiring board according to any one of (20) to (22), wherein the adhesion assisting agent layer contains an epoxy resin as an indispensable component.

(24) The printed wiring board according to (23), wherein the resin containing an epoxy resin as an indispensable component contains (A) an epoxy resin, (B) rubber particles, and (C) an epoxy resin curing agent.

(25) The printed wiring board according to (23) or (24), wherein the component (A) is a novolak epoxy resin or contains a novolak epoxy resin.

(26) The printed wiring board according to (24) or (25), wherein the component (A) has a biphenyl structure.

(27) The printed wiring board according to any one of (24) to (26), wherein the component (B) is crosslinked rubber particles.

(28) The printed wiring board according to any one of (24) to (27), wherein the component (B) is at least one substance selected from acrylonitrile-butadiene rubber particles, carboxylic acid-modified acrylonitrile-butadiene rubber particles, and butadiene rubber-acrylic resin core shell particles.

(29) The printed wiring board according to any one of (24) to (28), wherein the component (B) is added in an amount of 0.5 to 20 parts by weight to the component (A) 100 parts by weight.

(30) The printed wiring board according to any one of (24) to (29), wherein the component (C) is a novolak phenol resin.

(31) The printed wiring board according to any one of (24) to (30), wherein the component (C) is a cresol novolak phenol resin having a triazine ring.

(32) The printed wiring board according to any one of (20) to (31), wherein the adhesion assisting agent layer contains a polyamide imide resin as an indispensable component.

(33) The printed wiring board according to (32), wherein the polyamide imide resin is a polyamide imide comprising a saturated hydrocarbon as a unit component.

(34) The printed wiring board according to (32) or (33), wherein a curing component for crosslinking the polyamide imide by reaction is added.

According to one embodiment of the invention, it is made possible to provide a wiring board advantageous in the ultra fine wiring formation, electric properties, and production cost and having high reliability and excellent high frequency properties.

Also, according to another embodiment of the invention, it is made possible to provide a printed wiring board having improved resin-resin adhesion strength and excellent moisture absorption resistance and heat resistance.

Further, according to another embodiment of the invention, it is made possible to provide a printed wiring board having improved resin-metal adhesion strength and excellent moisture absorption resistance and heat resistance.

The present disclosure relates to subject matter contained in Japanese Patent Application No. 2004-024456, filed on Jan. 30, 2004 and No. 2004-116726, filed on Apr. 2, 2004, the disclosure of which is expressly incorporated herein by reference in its entirety.

DESCRIPTION OF THE PREFERRED EMBODIMENTS

Figure 1:
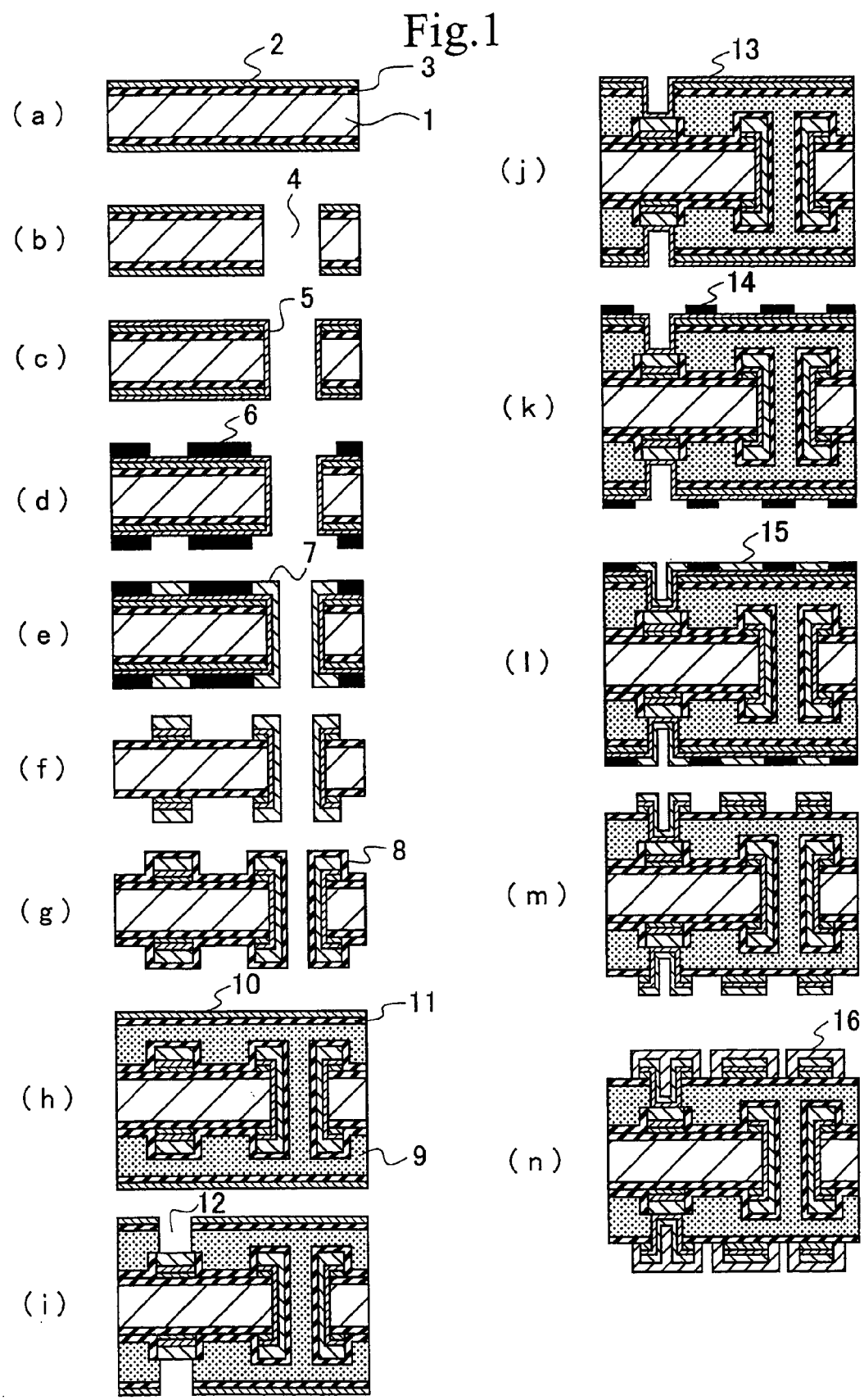
FIG. 1 is a cross-sectional view illustrating one example of the production process of a printed wiring board according to one embodiment of the invention.

Hereinafter, embodiments of the invention will be described in detail with reference to FIG. 1.

At first, a core substrate comprising two layers is produced. The production method of the core substrate in the invention is not particularly limited. The core substrate described here is a substrate in which wiring to be an intermediate for producing a substrate is formed. The following description is one example of a method for forming ultra fine wiring on the core substrate. The core substrate contains an insulating layer and a metal layer. For producing the substrate, preferably a method for forming a laminate plate as shown in FIG. 1(a) having a metal foil 2 in both sides of a prepreg 1 is used, since it is economical.

The prepreg is produced by immersing or coating a substrate with a resin composition. As the substrate, various types of well known substrates used for laminate plates for electric insulating materials may be used.

Examples of the materials for the substrate are inorganic fibers of such as E glass, D glass, S glass or Q glass; organic fibers of such as polyimides, polyesters, or tetrafluoroethylene; and their mixtures, however the materials are not limited to these examples. These substrates may be in any form such as woven fabrics, nonwoven fabrics, roving, chopped strand mats, surfacing mats and the like, however the materials are not limited to these examples. The materials and the forms of the substrate may be selected suitably depending on the uses and functions of the aimed formed products. Further, if necessary, those made of one or more kinds of materials and having one or more forms may be used. The thickness of the substrate is not particularly limited, however those with a thickness of about 0.03 to 0.5 mm may be used in general. Those subjected to surface-treatment with a silane coupling agent or the like or to mechanical fibrillation are preferable in terms of the heat resistance, moisture resistance, and processibility.

As a resin composition, conventionally known resin compositions to be used as insulating materials for a printed wiring board may be used. Generally, a thermosetting resin excellent in heat resistance and chemical resistance may be used as a base. Examples of the thermosetting resin are phenol resins, epoxy resins, cyanate resins, maleimide resins, isocyanate resins, benzocyclobutene resins, and vinyl resins, however the thermosetting resin is not limited to these examples. As the thermosetting resin, one kind of resins may be used alone or two kinds of resins may be mixed and used.

Among the thermosetting resins, the epoxy resins are widely used since they are excellent in heat resistance, chemical resistance, and electric properties and relatively economical. Examples of the epoxy resins are bisphenol type epoxy resins such as bisphenol A type epoxy resin, bisphenol F type epoxy resin, and bisphenol S type epoxy resin; novolak type epoxy resins such as phenol novolak type epoxy resin, cresol novolak type epoxy resin, and bisphenol A novolak type epoxy resin; alicyclic epoxy resins; aliphatic chain epoxy resins; diglycidyl ether compounds of bisphenol; diglycidyl ether compounds of naphthalene diol; diglycidyl ether compounds of phenol; diglycidyl ether compounds of alcohols; and their alkyl-substituted compounds, halogenated compounds, and hydrogenated compounds, however the epoxy resins are not limited to these examples. One kind of the epoxy resins may be used alone or two or more kinds of the epoxy resins may be mixed and used. As a curing agent to be used together with the epoxy resins, any agents may be used without particular limit if they can cure the epoxy resins. Examples of the curing agents are polyfunctional phenols, polyfunctional alcohols, amines, imidazole compounds, acid anhydrides, organic phosphorus compounds and their halides, however the curing agents are not limited to these examples. One kind of these epoxy resin curing agents may be used alone or two or more kinds may be mixed and used.

The cyanate ester resin is a thermosetting resin comprising triazine rings as repeating units and obtained by heating a cyanate compound. The resin is used in the case excellent high frequency properties are required since the resin is excellent in the dielectric properties. Examples of the cyanate compound are cyanate ester compounds such as 2,2-bis(4-cyanatophenyl)propane, bis(4-cyanatophenyl)ethane, 2,2-bis(3,5-dimethyl-4-cyanatophenyl)methane, 2,2-bis(4-cyanatophenyl)-1,1,1,3,3,3-hexafluoropropane, $\alpha,\alpha'$-bis(4-cyanatophenyl)-m-diisopropylbenzene, phenol novolak, and alkylphenol novolak, however the cyanate compound may not be limited particularly to these examples. Among them, 2,2-bis(4-cyanatophenyl)propane is preferable since it is excellent in the balance of the dielectric property of a cured product and curing property and is economically in terms of the cost. One kind of cyanate ester compounds may be used alone or two or more kinds may be mixed and used. The cyanate ester compound to be used here may be oligomerated partially into trimers and pentamers. A curing catalyst and a curing promoter may be added to the cyanate compound for curing. Examples of the curing catalyst may be metals such as manganese, iron, cobalt, nickel, copper, zinc and the like, however the catalyst may not be limited to these examples. Practical examples are organometal salts such as 2-ethylhexanates, naphthanates, and octylates; and organometal complexes such as acetylacetone complexes, however the catalyst may not be limited to these examples. They may be use alone or two or more kinds of them may be mixed and used. As a curing promoter, well known curing promoters may be used, however, phenols are preferable. Practically, examples are monofunctional phenols such as nonylphenyl and p-cumylphenyl; bifunctional phenols such as bisphenol A, bisphenol F, and bisphenol S; and polyfunctional phenols such as phenol novolak and cresol novolak, however it is not limited to these examples. They may be used alone or two or more kinds of them may be mixed and used.

In consideration of the dielectric properties, impact resistance, and film formability, the resin composition may be blended with a thermoplastic resin. Examples of the thermoplastic resin are fluoro resins, polyphenylene ethers, modified polyphenylene ethers, polyphenylene sulfides, polycarbonates, polyether imides, polyether ether ketones, polyallylates, polyamides, polyamide imides, polybutadienes, however the thermoplastic resin is not limited to these examples The thermoplastic resins may be used alone or two or more types of them may be mixed and used.

Among the thermoplastic resins, in the case of adding polyphenylene ethers and modified polyphenylene ethers, the dielectric properties of cured materials are improved and therefore they are useful. Examples of the polyphenylene ethers and modified polyphenylene ethers are poly(2,6-dimethyl-1,4-phenylene) ether, alloyed polymers of poly(2,6-dimethyl-1,4-phenylene) ether and polystyrene, alloyed polymers of poly(2,6-dimethyl-1,4-phenylene) ether and styrene-butadiene copolymers, alloyed polymers of poly(2,6-dimethyl-1,4-phenylene) ether and styrene-maleic anhydride copolymers, alloyed polymers of poly(2,6-dimethyl-1,4-phenylene) ether and polyamides, and alloyed polymers of poly(2,6-dimethyl-1,4-phenylene) ether and styrene-butadiene-acrylonitrile copolymers, however they are not limited to these examples. Further, to provide reactivity and polymerizability to the polyphenylene ethers, functional groups such as amino, epoxy group, carboxyl, styryl, and methacryl may be introduced into polymer terminals or functional groups such as amino, epoxy group, carboxyl, styryl, and methacryl may be introduced into the polymer side chains.

Among the thermoplastic resins, polyamide imide resins are excellent in heat resistance, moisture resistance and adhesive to metal and therefore useful. Raw materials of the polyamide imide resins include acidic components and amine components. Examples of the acid components are trimellitic anhydride and trimellitic anhydride monochloride, however the components are not limited to these examples. Examples of the amine components are m-phenylenediamine, p-phenylenediamine, 4,4'-diaminodiphenyl ether, 4,4'-diaminodiphenylmethane, bis[4-(aminophenoxy)phenyl]sulfone, 2,2'-bis[4-(4-aminophenoxy)phenyl]propane, however the amine components are not limited to these examples. To improve the drying property, polyimide amide resins may be modified with siloxane. In such as case, siloxane diamine is used as the amino components. In consideration of the processibility, it is preferable to use polyimide amide resins having a molecular weight of 50,000 or more.

The resin composition may contain inorganic filler. Examples of the inorganic filler are alumina, aluminum hydroxide, magnesium hydroxide, clay, talc, antimony trioxide, antimony pentoxide, zinc oxide, fused silica, glass powder, quartz powder, and shirasu balloon, however the inorganic filler may not be limited to the examples. These inorganic fillers may be used alone or two or more of them may be mixed and used.

The resin composition may contain an organic solvent. Examples of the organic solvent are aromatic hydrocarbons solvents such as benzene, toluene, xylene, and trimethylbenzene; ketone type solvents methyl ethyl ketone and methyl isobutyl ketone; ether type solvents such as tetrahydrofuran;

alcohol type solvents such as isopropanol and butanol; ether alcohol type solvents such as 2-methoxyethanol, and 2-butoxyethanol; and amido type solvents such as N-methylpyrrolidone, N,N-dimethylformamide, and N, N-dimethylacetamide, however the organic solvent may not be limited to these examples and these solvents may be used properly in combination. The solvent amount in a varnish in the case of producing a prepreg is preferably in a range of 40 to 80% by weight and the viscosity of the varnish is preferably in a range of 20 to 100 cP.

The resin composition may contain a flame retardant. Examples to be used as the flame retardant are conventionally known flame retardants such as bromo compounds such as decabromodiphenyl ether, tetrabromobisphenol A, tetrabromophthalic anhydride, and tribromophenol; phosphorus compounds such as triphenyl phosphate, tricresyl phosphate, trixylyl phosphate, cresyldiphenyl phosphate; metal hydroxides such as magnesium hydroxide and aluminum hydroxide; red phosphorus and its modified products; antimony compounds such as antimony trioxide and antimony pentoxide; and triazine compounds such as melamine, cyanuric acid, melamine cyanurate, however the flame retardant is not limited to these examples.

Further, if necessary, various kinds of additives and fillers such as a curing agent, a curing promoting agent, thermoplastic particles, a coloring agent, a UV impermeable agent, an antioxidant, and a reducing agent may be added to the resin composition in the production.

In general, the substrate is impregnated in or coated with the resin composition in an adhesion amount of the composition to the substrate adjusted so as to be 20 to 90% by weight on the basis of resin content in the prepreg after drying and then the resin composition is dried generally at 100 to 200° C. for 1 to 30 minutes to obtain a prepreg in semi-cured state (in B stage state). One to twenty sheets of such prepreg are laminated; metal foils are attached to both faces and then the entire body of the resulting laminate is pressurized while being heated. Conventional laminate plate production technique may be employed for the forming conditions. For example, multi-step pressing, multi-press vacuum pressing, continuous forming, autoclave formation apparatus may be used for the formation. The formation may be carried out in conditions of 100 to 250° C. temperature, 2 to 100 kg/cm$^2$ pressure, and 0.1 to 5 hour heating. Also, using a vacuum lamination apparatus, the formation may be carried out in laminating conditions of 50 to 150° C. temperature and 0.1 to 5 MPa vacuum or atmospheric pressure. The thickness of the prepreg layer to be an insulating layer may differ depending on the uses, however it is generally preferably 0.1 to 5.0 mm.

Preferably, both faces of the metal foils to be used for the invention have 2.0 μm or less ten-point mean surface roughness (Rz) defined in JIS B 0601 in view of electric property. As a metal foil, copper foils, nickel foils and aluminum foils may be used, however, copper foils are generally used. The production conditions of the copper foils are commonly sulfuric acid 50 to 100 g/L, copper 30 to 100 g/L, solution temperature 20 to 80° C., and current density 0.5 to 100 A/dm$^2$ in the case of a copper sulfate bath and potassium pyrophosphate 100 to 700 g/L, copper 10 to 50 g/L, solution temperature 30 to 60° C., pH 8 to 12, and current density 1 to 10 A/dm$^2$ in the case of a copper pyrophosphate bath. Various kinds of additives may be added in consideration of the physical properties and smoothness of copper. Generally, roughening treatment is carried out on the surface of a copper foil, however, no roughing treatment is carried out substantially in an embodiments of the invention. Therefore, the unevenness of the metal foil is slight. Therefore, it is advantageous since the copper foils do not remain when the metal foils formed on the resin layer are removed by etching.

Further, the foils to be used preferably are peelable type metal foils with a thickness of 5 μm or thinner, more preferably 3 μm or thinner and a surface roughness Rz of 2.0 μm or less. The peelable type metal foils are those having a carrier and the carrier is separable. For example, in the case of peelable type ultra thin copper foils, a metal oxide or an organic layer to be a peeling layer is formed on a carrier foil with a thickness of 10 to 50 μm and metal foils may be formed under the conditions of sulfuric acid 50 to 100 g/L, copper 30 to 100 g/L, solution temperature 20 to 80° C., and current density 0.5 to 100 A/dm$^2$ in the case of a copper sulfate bath. Also, the metal foils with a thickness of 0.3 to 3.0 μm may be formed under the conditions of potassium pyrophosphate 100 to 700 g/L, copper 10 to 50 g/L, solution temperature 30 to 60° C., pH 8 to 12, and current density 1 to 10 A/dm$^2$ in the case of a copper pyrophosphate bath. In the case of using such foils as electric power supply layers, the wiring formability is excellent as it will be described later. In place of the peelable type foils, etchable type copper foils having an aluminum carrier or a nickel carrier may be used.

The anti-rust treatment for the faces of the metal foils to be stuck to a resin may be carried out by using nickel, tin, zinc, chromium, molybdenum, cobalt or their alloys. It is preferable to selected at least one of nickel, zinc or chromium. Thin film formation on the metal foils is carried out by using the metal or alloys by sputtering, electroplating, or electroless plating. Among them, in terms of the cost, electroplating is preferable. Practically, plating is carried out by using a plating solution containing one or more salts of the above-exemplified metals to form the plating layer. In view of reliability, it is preferably to use a plating solution containing zinc. A complexing agent such as a citric acid salt, tartaric acid salt, sulfamic acid may be added to make metal ion precipitation easy. The plating solution is generally used in an acidic region and plating is carried out at a room temperature to 80° C. Generally, the plating is carried out under the conditions suitably selected form 0.1 to 10 A/dm$^2$ for the current density and 1 to 60 seconds, preferably 1 to 30 seconds for the current application period. The deposition amount of the anti-rust treatment metal differs depending on the metal type, however it is preferably 10 to 2,000 μg/dm$^2$ in total. If the thickness of the anti-rust treatment is too thick, it results in etching inhibition and electric property deterioration and if the thickness is too thin, it results in decrease of the peel strength to the resin.

Further, if a chromate treatment layer is formed on the anti-rust treatment layer, decrease of the peel strength to the resin is suppressed and therefore, it is advantageous. Practically, the treatment is carried out by using an aqueous solution containing hexavalent chromium ion. The chromate treatment can be carried out by simple dipping treatment, however cathode treatment is carried out preferably. The treatment may be carried out preferably under the conditions of sodium dichromate 0.1 to 50 g/L, pH 1 to 13, bath temperature 0 to 60° C., current density 0.1 to 5 A/dm$^2$, and electrolytic period 0.1 to 100 seconds. Chromic acid or potassium dichromate may be used in place of sodium dichromate.

In the invention, it is preferable that a silane coupling agent is adsorbed in the outermost layers of the metal foils. Examples of the silane coupling agent are epoxy functional silanes such as 3-glycidoxypropyltrimethoxysilane and 2-(3, 4-epoxycyclohexylethyltrimethoxysilane; amino functional silanes such as 3-aminopropyltrimethoxysilane, N-2-(aminoethyl)-3-aminopropyltrimethoxysilane, and N-2-(aminoethyl)-3-aminopropylmethyldimethoxysilane; olefin functional silanes such as vinyltrimethoxysilane, vinylphenyltrimethoxysilane, and vinyltris(2-methoxyethoxy)silane; acrylic functional silanes such as 3-acryloxypropyltrimethoxysilane; methacrylic functional silanes such as 3-methacryloxypropyltrimethoxysilane; and mercapto functional silanes such as 3-mercaptopropyltrimethoxysilane. In view of the combination with adhesion assisting agent, a silane coupling agent preferably has an epoxy group or amino group in the molecule. They may be used alone or a plurality of the silanes may be mixed and used. These coupling agents may be dissolved in a solvent in a concentration of 0.1 to 15 g/L and applied to the metal foils at a room temperature to 50° C. or electrodeposited for the adsorption. These silane coupling agents form a coating by forming condensation bonding with the hydroxyl groups of the anti-rust metal on the metal foil surface. Stable bonds can be formed by heating or UR radiation after the silane coupling agent treatment. In the case of heating, the silane coupling treatment is dried at 100 to 200° C. for 2 to 60 second. In the case of UV radiation, the radiation is carried out with 200 to 400 nm wavelength and 200 to 2,500 mJ/cm$^2$ intensity.

The adhesion assisting agent containing an epoxy resin as an indispensable component is applied to the copper foil subjected to treatment with a silane coupling agent. The thickness of the coating of the adhesion assisting agent is preferably 0.1 to 10 μm and more preferably 0.1 to 5.0 μm.

The adhesion assisting agent of the invention is preferably contains (A) an epoxy resin, (B) rubber particles, and (C) an epoxy resin curing agent.

The component (A) is preferably a novolak type epoxy resin alone or contain another component (A) besides a novolak type epoxy resin.

The novolak type epoxy resin in the invention is preferably a novolak type epoxy resin having a biphenyl structure. The novolak type epoxy resin having a biphenyl structure means a novolak type epoxy resin having an aromatic ring of a biphenyl derivative in the molecule and may be the resin defined by the following Formula (1). The resin may be used alone or two or more of such resins may be used in combination.

by carrying out the copolymerization in the presence of carboxylic acid such as acrylic acid and methacrylic acid additionally. The butadiene rubber-acrylic resin core shell particles can be obtained by a two-step polymerization method by polymerizing butadiene particles by emulsion polymerization and successively continuing polymerization by adding monomers such as acrylic acid esters and acrylic acid. The size of the particles may be adjusted to be 50 nm to 1 μm on the basis of the average primary particle diameter. They may be used alone or two or more types of the particles may be used in combination.

As a commercialized product of the carboxylic acid-modified acrylonitrile-butadiene rubber particles, XER-91 manufactured by JSR Co., Ltd. is available. As the commercialized products of the butadiene rubber-acrylic resin core shell particles, EXL-2655 manufactured by Kureha Chemical Industry Co., Ltd. and AC-3832 manufactured by Takeda Pharmaceutical Co., Ltd. are available.

It is preferable that the component (B) is contained in an amount of 0.5 to 20 parts by weight to the component (A) 100 parts by weight.

The component (C) is preferably a novolak type phenol resin and more preferably a cresol novolak type phenol resin having a triazine ring.

The cresol novolak type phenol resin having a triazine ring in the invention includes cresol novolak type phenol resins having triazine rings in the main chains of the cresol novolak type phenol resins. The nitrogen content in the cresol novolak type phenol resin having a triazine ring is preferably 12 to 22% by weight, more preferably 17 to 19% by weight, even more preferably 18% by weight. If the nitrogen content in the molecule is in the range, the dielectric loss is not so high and in the case of using the adhesion assisting agent as a varnish, the solubility in a solvent becomes suitable to suppress the amount of un-dissolved remaining. Those having a number average molecular weight of 500 to 600 may be used as the cresol novolak type phenol resin having a triazine ring. The

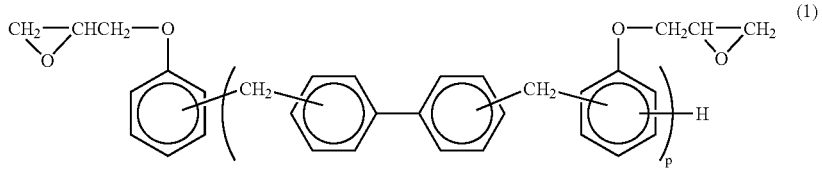

wherein p denotes 1 to 5.

As commercialized products, NC-3000S (epoxy resin defined by Formula (1) of which the average value of p is 1.7) and NC-3000S-H (epoxy resin defined by Formula (1) of which the average value of p is 2.8) manufactured by Nippon Kayaku Co., Ltd. can be exemplified.

The component (B) is preferably crosslinked rubber particles and may preferably be at least one substance selected from acrylonitrile-butadiene rubber particles, carboxylic acid-modified acrylonitrile-butadiene rubber particles, and butadiene rubber-acrylic resin core shell particles.

The acrylonitrile-butadiene rubber particles may be obtained by copolymerizing acrylonitrile and butadiene and carrying out partial crosslinking and granulation in the process of the copolymerization. The carboxylic acid-modified acrylonitrile-butadiene rubber particles may also be obtained cresol novolak type phenol resin having a triazine ring may be used alone or two or more types of such resins may be used in combination.

The cresol novolak type phenol resin having a triazine ring can be obtained by reaction of cresol, aldehyde, and a triazine ring-containing compound at pH 5 to 9. Any of o-, m-, and p-cresol isomers may be used as the cresol. Melamine, guanamine and its derivatives, and cyanuric acid and its derivative may be used as the triazine ring-containing compound.

As a commercialized product, triazine ring-containing cresol novolak type phenol resin Phenolite EXB-9829 (nitrogen content 18% by weight) manufactured by Dainippon Ink and Chemicals, Inc. is available.

To improve the flame retardancy, (D) a phenolic hydroxyl-containing phosphorus compound may be added to the adhesion assisting agent.

The phenolic hydroxyl-containing phosphorus compound (D) may be compounds defined by the following Formula (2). They may be used alone or two or more in a combination.

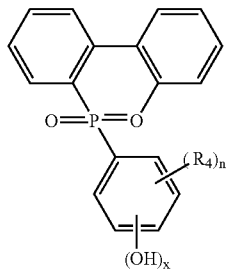

(2)

wherein in the case n is 1, the substituent $R_4$ denotes a hydrogen atom, a straight chain or branched alkyl group, a cycloalkyl group, an aryl group or an aralkyl group; in the case n is 2, the respective substituents $R_4$ independently denote a hydrogen atom, a straight chain or branched alkyl group, a cycloalkyl group, an aryl group or an aralkyl group or may be bonded each other together with the bonded carbon atoms to form an unsubstituted or alkyl- or cycloalkyl-substituted benzene ring; and x is a natural number of 2 or higher.

In the case $R_4$ denotes a straight chain or branched alkyl in Formula (2), $C_1$ to $C_6$ alkyl groups are preferable and in the case of a cycloalkyl group, $C_6$ to $C_8$ cycloalkyl groups are preferable. In the case of an aryl group, phenyl group is preferable and in the case of an aralkyl, $C_7$ to $C_{10}$ aralkyl groups are preferable. The x is preferably 2. In the case n is 2 in Formula (2) and the respective two substituents $R_4$ are bonded each other together with the bonded carbon atoms to form an unsubstituted or alkyl- or cycloalkyl-substituted benzene ring, a benzene ring unsubstituted or substituted with $C_1$ to $C_4$ alkyl groups or $C_6$ to $C_8$ cycloalkyl groups is preferable.

Practically, the phenolic hydroxyl-containing phosphorus compound (D) may be the compound defined by the following Formula (3) or Formula (4).

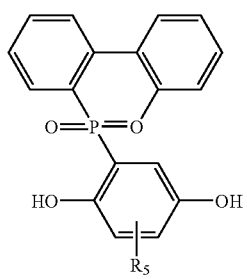

(3)

or

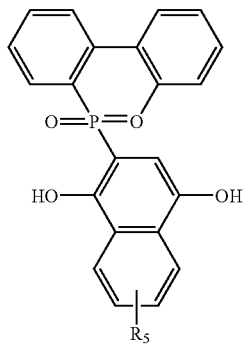

(4)

wherein $R_5$ denotes a hydrogen atom, methyl, ethyl, n-propyl, isopropyl, n-butyl, isobutyl, sec-butyl, tert-butyl group, or cyclohexyl group.

As the phenolic hydroxyl-containing phosphorus compound (D), 10-(2,5-dihydroxyphenyl)-9,10-dihydro-9-oxa-10-phosphaphenanthrene-10-oxide and its derivative are preferable.

As a commercialized product of the phenolic hydroxyl-containing phosphorus compound (D), HCA-HQ manufactured by Sanko Co., Ltd. is available.

To improve the reliability, the adhesion assisting agent in the invention may contain (E) an inorganic filler.

The inorganic filler (E) in the invention is not particularly limited and silica, fused silica, talc, alumina, aluminum hydroxide, barium sulfate, calcium hydroxide, aerosil, and calcium carbonate can be exemplified. For the purpose of improving the dispersibility, the inorganic filler includes those treated with various coupling agents such as silane coupling agents. They may be used alone or two or more of them may be used in combination. In terms of the dielectric property and low thermal expansion, silica is preferable.

The addition amount of epoxy resin (A) in the adhesion assisting agent in the invention is preferably in a range of 69 to 94% by weight, more preferably 78 to 90% by weight, in the total weight of the components (A) to (C). If the addition amount is in the range, the heat resistance for welding is high and the fluidity is suitable at the time of application of the adhesion assisting agent to a copper foil to prevent uneven surface formation in a cured coating film.

The addition amount of the rubber particles (B) in the adhesion assisting agent in the invention is preferably 0.5% by weight or more, more preferably in a range of 1 to 20% by weight, furthermore preferably 2% by weight or more, even more preferably in a range of 3 to 13% by weight and even more preferably 4 to 8% by weight in the total weight of the components (A) to (C). If the addition amount is in the range, the appearance of the coating film is good before and after drying in the case of application of the adhesion assisting agent to a copper foil and the problems of unevenness owing to roughening and insufficient insulation reliability hardly occur.

The addition amount of epoxy resin curing agent (C) in the adhesion assisting agent in the invention is preferably in a range of 5 to 19% by weight, more preferably 6 to 11% by weight, in the total weight of the components (A) to (C). If the addition amount is in the range, a sufficient adhesive strength to a conductive layer without roughening and dielectric loss occurs, and thermal expansion coefficient and elongation in a cured coating film is desirable and the problems of disconnection and dielectric loss deterioration hardly occur.

In the case of providing flame retardancy, the addition amount of phenolic hydroxyl-containing phosphorus compound (D) in the adhesion assisting agent in the invention is preferably in a range of 1.5 to 2.5% by weight, more preferably 1.8 to 2.2% by weight on the basis of a phosphorus atom, in the total weight of the components (A) to (C). If the addition amount is in the range, the flame retardancy is good, the insulation reliability is excellent, and the Tg of a cured coating film is prevented from decreasing too much.

In the adhesion assisting agent in the invention, the ratio (the number of hydroxyl group/the number of epoxy group) of the number of total hydroxyl groups of the components (C) and (D) to the number of epoxy groups of the component (A) is preferably in a range of 0.6 to 1.3, more preferably 0.75 to 1.25. If the ratio is in the range, the hardness is sufficient and dielectric loss and thermal expansion coefficient of a cured coating film can be suppressed and also sufficient elongation of the coating film can be obtained. Further, proper roughening is made possible and accordingly, a sufficient adhesion strength to a conductive layer can be obtained.

Also, in the adhesion assisting agent in the invention, the ratio (the number of hydroxyl group/the number of epoxy group) of the number of hydroxyl groups of the component (C) to the number of epoxy groups of the component (A) is preferably in a range of 0.15 to 0.50, more preferably 0.17 to 0.30. If the ratio is in the range, sufficient elongation of the coating film can be obtained and the problem of insufficient adhesive strength to the conductive layer can be avoided.

In the case of using the inorganic filler (E) for improving the reliability, the addition amount of inorganic filler (E) is preferably in a range of 5 to 35% by volume, more preferably 10 to 30% by volume, in the total weight of the components (A) to (E). If the addition amount is in the range, the thermal expansion coefficient and dielectric loss increase can be prevented and sufficient flow can be obtained in the case of forming an insulating layer in an inner layer circuit. Additionally, if the inorganic filler is dispersed in the adhesion assisting agent in the invention, for example, a known kneading method using a kneader, a ball mill, a bead mill, and three rolls can be employed.

The adhesion assisting agent of the invention may further contain a variety of imidazoles and $BF_3$ amine complexes, which are latent thermosetting agent, as reaction promoters. In terms of the storage stability, handling easiness in B-stage, and heat resistance for welding of the adhesion assisting agent, 2-phenylimidazole, 2-ethyl-4-methylimidazole, and 1-cyanoethyl-2-phenylimidazolium trimellitate are preferable. The addition amount of them is preferably in a range of 0.2 to 0.6% by weight to the epoxy resin (A). If it is in the range, sufficiently high heat resistance to welding, good storage stability of the adhesion assisting agent, and easy handling in the B-stage can be obtained.

The adhesion assisting agent of the invention may be mixed with additives such as a pigment, a leveling agent, a defoaming agent, and an ion trapping agent if necessity.

Other than the above-mentioned adhesion assisting agent containing the epoxy resin as an indispensable component, an adhesion assisting agent containing a polyamide imide resin as an indispensable component may be used.

As a production method of polyamide imide, an isocyanate method involving reaction of trimellitic anhydride and aromatic diisocyanate is known. As a practical application example, U.S. Pat. No. 2,897,186 discloses a method of causing a reaction of an aromatic tricarboxylic acid anhydride and a diamine having an ether bond in diamine excess condition and then causing a reaction of the reaction product with diisocyanate. JP-A No. 04-182466 discloses a method of causing a reaction of an aromatic diamine and trimellitic anhydride.

In recent years, to try to improve the properties such as elasticity, flexibility, and drying efficiency, siloxane structure was introduced into the polyamide imide. Such a polyamide imide can be produced also by the isocyanate method. JP-A No. 04-182466 discloses a method of causing condensation polymerization of an aromatic tricarboxylic acid anhydride, an aromatic diisocyanate, and siloxanediamine. Also, JP-A No. 06-116517 discloses a method of causing condensation polymerization of an aromatic dicarboxylic acid or an aromatic tricarboxylic acid with siloxanediamine. Further, JP-A No. 11-130831 discloses a method of causing a reaction of a mixture containing diamine having 3 or more aromatic rings and siloxanediamine with trimellitic anhydride to obtain a mixture containing diimidodicarboxylic acid, and causing reaction of an aromatic diisocyanate with the obtained mixture.

The subject matter of the mentioned U.S. Pat. No. 2,897,186, JP-A Nos. 04-182466, 06-116517 and 11-130831 are hereby incorporated herein by reference.

Sufficient adhesion strength can be obtained by the above-mentioned method and use of polyamide imide comprising a saturated hydrocarbon as a unit component and therefore having high moisture absorption resistance and heat resistance is preferable in terms of the reliability.

The polyamide imide to be used in the invention is characterized in that it comprises a saturated hydrocarbon as a unit component and an alicyclic hydrocarbon group is desirable for the unit component. The polyamide imide is further provided with a high Tg in addition to the high moisture absorption resistance and heat resistance owing to the existence of the alicyclic hydrocarbon group.

The saturated hydrocarbon component comprising the alicyclic hydrocarbon group may be derived from a diamine compound comprising a saturated hydrocarbon having an alicyclic hydrocarbon group as a raw material.

Such a diamine is defined by the following general formula (4a) or (4b).

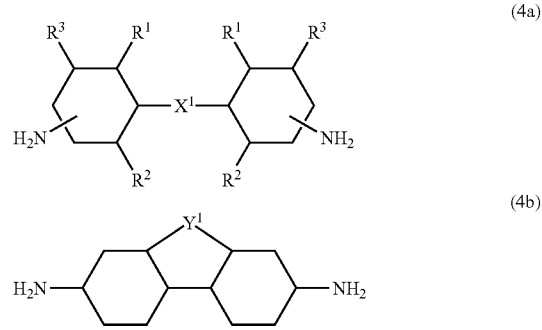

In the formula, $X^1$ represents an aliphatic hydrocarbon group having 1 to 3 carbon atoms, a halo aliphatic hydrocarbon group having 1 to 3 carbon atoms, sulfonyl, an ether group, carbonyl, a single bond, or a divalent group defined by the following general formula (5a) or (5b); $Y^1$ represents an aliphatic hydrocarbon group having 1 to 3 carbon atoms, a halo aliphatic hydrocarbon group having 1 to 3 carbon atoms, sulfonyl, an ether group, or carbonyl; $R^1$, $R^2$, and $R^3$ may be same or different from one another and independently represent a hydrogen atom, hydroxyl, methoxy group, methyl, or a halo methyl:

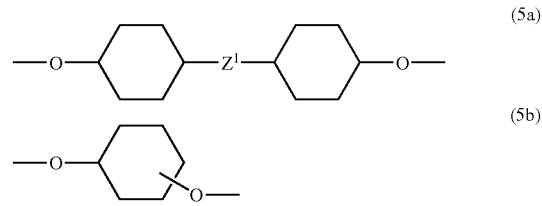

wherein $Z^1$ represents an aliphatic hydrocarbon group having 1 to 3 carbon atoms, a halo aliphatic hydrocarbon group having 1 to 3 carbon atoms, sulfonyl, an ether group, carbonyl, or a single bond.

Examples of the diamine compound comprising a saturated hydrocarbon having an alicyclic hydrocarbon group are 2,2-bis[4-(4-aminocyclohexyloxy)cyclohexyl]propane, bis[4-(3-aminocyclohexyloxy)cyclohexyl]sulfone, bis[4-(4-aminocyclohexyloxy)cyclohexyl]sulfone, 2,2-bis[4-(4-aminocyclohexyloxy)cyclohexyl]hexafluoropropane, bis[4-(4-aminocyclohexyloxy)cyclohexyl]methane, 4,4'-bis(4-aminocyclohexyloxy)dicyclohexyl, bis[4-(4-aminocyclohexyloxy)cyclohexyl]ether, bis[4-(4-aminocyclohexyloxy)cyclohexyl]ketone, 1,3-bis(4-aminocyclohexyloxy)benzene, 1,4-bis(4-aminocyclohexyloxy)benzene, 2,2'-dimethylbicyclohexyl-4,4'-diamine, 2,2'-bis(trifluoromethyl)dicyclohexyl-4,4'-diamine, 2,6,2',6'-tetramethyl-4,4'-diamine, 5,5'-dimethyl-2,2'-sulfonyl-dicyclohexyl-4,4'-diamine, 3,3'-dihydroxydicyclohexyl-4,4'-diamine, (4,4'-diamino)dicyclohexyl ether, (4,4'-diamino)dicyclohexylsulfone, (4,4'-diaminocyclohexyl)ketone, (3,3'-diamino)benzophenone, (4,4'-diamino)dicyclohexylmethane, (4,4'-diamino)dicyclohexyl ether, (3,3'-diamino)dicyclohexyl ether, (4,4'-diamino)dicyclohexylmethane, (3,3'-diamino)dicyclohexyl ether, and 2,2-bis(4-aminocyclohexyl)propane, however the diamine compound is not limited to these examples. Two or more kinds of these diamine compounds may be mixed and used and further, other diamine compounds may be used in combination.

Such a diamine compound comprising a saturated hydrocarbon having an alicyclic hydrocarbon group is easily produced by hydrogen to reduce an aromatic diamine compound.

Examples of such an aromatic diamine compound are 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)diphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)diphenyl-4,4'-diamine, 2,6,2',6'-tetramethyl-4,4'-diamine, 5,5'-dimethyl-2,2'-sulfonyl-biphenyl-4.4'-diamine, 3,3'-dihydroxydiphenyl-4,4'-diamine, (4,4'-diamino)diphenyl ether, (4,4'-diamino)diphenylsulfone, (4,4'-diamino)benzophenone, (3,3'-diamino)benzophenone, (4,4'-diamino)diphenylmethane, (4,4'-diamino)diphenyl ether, and (3,3'-diamino)diphenyl ether, however, the aromatic diamine compound is not limited to these examples.

Hydrogen reduction of the aromatic diamine compound is carried out by a general reduction method of an aromatic ring. Practically, examples of the method are methods using catalyst systems such as Raney Nikkel and platinum oxide in the presence of hydrogen (D. Varech et al, Tetrahedron Letter 26, 61(1985); R. H. Baker et al, J. Am. Chem. Soc., 69, 1250 (1947)); rhodium-aluminum oxide (J. C. Sircar et al, J. Org. Chem., 30, 3206(1965); A. I. Meyers et al, Organic Synthesis Collective Volume VI, 371(1988); A. W. Burgstahler, Organic Synthesis Collective Volume V, 591(1973); A. J. Briggs, synthesis, 1988, 66); rhodium oxide-platinum oxide (S. Nishimura, Bull, Chem. Soc. Jpn., 34, 32(1961); E. J. Corey et al, J. Am. Chem. Soc. 101, 1608(1979)); charcoal carrying rhodium (K. Chebaane et al, Bull. Soc. Chim. Fr., 1975, 244) and sodium boron hydride-rhodium chloride system (P. G. Gassman et al, Organic Synthesis Collective Volume VI, 581 (1988); P. G. Gassman et al, Organic Synthesis Collective Volume VI, 601 (1988)), however the method is not limited to these exemplified methods.

In addition to the above-mentioned diamine compound as the aliphatic diamine compound, a compound defined by the following general formula (4) may be used in the polyamide imide and its production method of the invention.

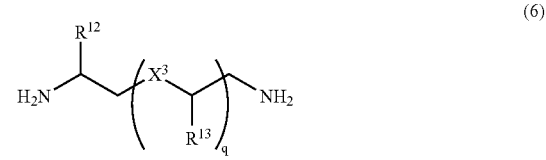

(6)

In the formula, $X^3$ represents methylene group, sulfonyl, an ether group, carbonyl, or a single bond; $R^{12}$ and $R^{13}$ independently represent a hydrogen atom, an alkyl, phenyl, or a substituted phenyl; and q represents an integer of 1 to 50.

Practical examples for $R^{12}$ and $R^{13}$ are preferably a hydrogen atom, an alkyl with 1 to 3 carbon atoms, phenyl, and a substituted phenyl. As the substituent group to be bonded to the phenyl, an alkyl with 1 to 3 carbon atoms and halogen atoms can be exemplified.

With respect to the aliphatic diamine defined by the above-mentioned general formula (6), $X^3$ in the formula (6) is preferably an ether group in terms of the low modulus of elasticity and high Tg. Examples of such an aliphatic diamine are Jeffamine D-400 and Jeffamine D-200 manufactured by Huntsman LLC, however it is not limited to these examples.

It is supposed that the polyamide imide having the above-mentioned aliphatic structure is provided with extremely high water absorbing ability and water-shedding property as compared with a conventional polyamide imide. Accordingly, in the case the polyamide imide comprising the saturated hydrocarbon containing the alicyclic hydrocarbon group is used for a thermosetting resin composition, which will be described later, as the layer formation material of a laminate, the decrease of the adhesion strength at the time of absorbing moisture is suppressed as compared with that in the case of using a polyamide imide composition containing aromatic composition before the hydrogen reduction.

In the polyamide imide and the production method of the invention, in addition to the above-exemplified diamine compounds as the diamine compound, an aromatic diamine may further be added.

Examples of such an aromatic diamine compound are those defined by the following general formula (7a) or the following general formula (7b).

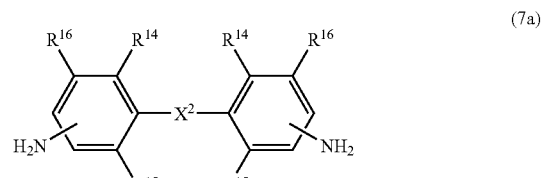

(7a)

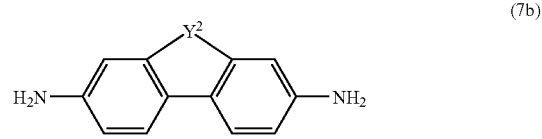

(7b)

In the above-mentioned general formula (7a), $X^2$ represents an aliphatic hydrocarbon group having 1 to 3 carbon atoms, a halo aliphatic hydrocarbon group having 1 to 3 carbon atoms, sulfonyl, an ether group, carbonyl, a single bond, or a divalent group defined by the following general formula (8a) or (8b); $R^{14}$, $R^{15}$, and $R^{16}$ may be same or different from one another and independently represent a hydrogen atom, hydroxyl, methoxy group, methyl, or a halo methyl: and in the above-mentioned general formula (7b), $Y^2$ represents an aliphatic hydrocarbon group having 1 to 3 carbon atoms, a halo aliphatic hydrocarbon group having 1 to 3 carbon atoms, sulfonyl, an ether group, or carbonyl;

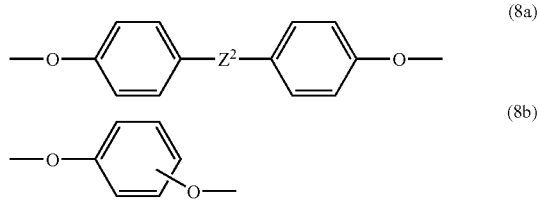

(8a)

(8b)

wherein $Z^2$ represents an aliphatic hydrocarbon group having 1 to 3 carbon atoms, a halo aliphatic hydrocarbon group having 1 to 3 carbon atoms, sulfonyl, an ether group, carbonyl, or a single bond.

As the above-mentioned aromatic diamine, compounds comprising aromatic ring system to which two amino groups are directly bonded and diamines to which two or more aromatic rings are directly or through one functional group bonded can be exemplified without any particular limit. Practical examples of the diamine are 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)diphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)biphenyl-4,4'-diamine, 2,6,2',6'-tetramethyl-4,4'-diamine, 5,5'-dimethyl-2,2'-sulfonyl-biphenyl-4.4'-diamine, 3,3'-dihydroxydiphenyl-4,4'-diamine, (4,4'-diamino)diphenyl ether, (4,4'-diamino)diphenylsulfone, (4,4'-diaminophenyl)benzophenone, (3,3'-diamino)benzophenone, (4,4'-diamino)diphenylmethane, (4,4'-diamino)diphenyl ether, and (3,3'-diamino)diphenyl ether, however, the aromatic diamine compound is not limited to these examples. Two of more kinds of these aromatic diamine compounds may be mixed and used.

Use of the above-mentioned aromatic diamine compounds further increases Tg and improves the heat resistance.

In the polyamide imide and its production method of the invention, in addition to the above-exemplified diamine compounds as the diamine compound, a siloxane diamine defined by the general formula (9) may be further contained.

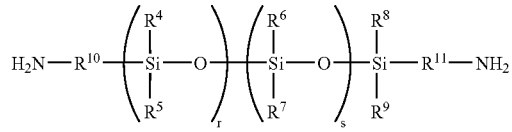

(9)

In the general formula (9), $R^4$ to $R^9$ independently represent preferably an alkyl having 1 to 3 carbon atoms, phenyl, or a substituted phenyl. As the substituent group of the substituted phenyl, an alkyl having 1 to 3 carbon atoms or a halogen atom is preferable. $R^{10}$ to $R^{11}$ independently represent preferably an alkylene having 1 to 6 carbon atoms or an arylene group. As the arylene group, phenylene, substituted phenylene, naphthalene, or substituted naphthalene is preferable. As the substituent group of the substituted arylene, an alkyl having 1 to 3 carbon atoms or a halogen atom is preferable. Additionally, $R^4$ to $R^{11}$ which respectively exist in plural number may be the same or different from one another. The r and s may be an integer selected from 1 to 15, respectively. As such a siloxanediamine, dimethylsiloxane-terminated diamines are particularly preferable. These siloxanediamines may be used alone or in combinations. Examples of the siloxanediamine defined by the above-mentioned general formula (9) are Silicone Oil X-22-161AS (amine equivalent 450), X-22-161A (amine equivalent 840), X-22-161B (amine equivalent 1,500), X-22-9409 (amine equivalent 700), X-22-1660B-3 (amine equivalent 2,200) (all exemplified above are manufactured by Shin-Etsu Chemical Co., Ltd.), BY16-853 (amine equivalent 650), BY16-853BA (amine equivalent 200), (all exemplified above are manufactured by Dow Corning Toray Co., Ltd.) and they are industrially made available, however the siloxanediamine is not limited to these examples.

In a production method of the polyamide imide, addition of the above-mentioned siloxanediamine makes the polyamide imide to be obtained have the siloxane structure in the main chain. Therefore, the flexibility of the polyamide imide to be obtained can be improved and occurrence of blisters or the like under high temperature condition can remarkably be suppressed.

In the production method of polyamide imide, the amino groups of the above-mentioned diamine compounds are reacted with carboxyl groups of trimellitic anhydride or carboxyl anhydride. Among them, reaction with carboxyl anhydride is preferable. Such a reaction is carried out at 70 to 100° C. in a non-proton type polar solvent.

Examples of the non-proton type polar solvent are N-methyl-2-pyrrolidone (NMP), γ-butyrolactone, dimethylformamide, dimethylacetamide, dimethyl sulfoxide, sulfolane, and cyclohexanone, however non-proton type polar solvent is not limited to these examples. One or more of these solvents may be used, however NMP is preferable to be used.

Such a non-proton type polar solvent is added in an amount so as to control the solid content preferably 10 to 70% by weight, more preferably 20 to 60% by weight, in the entire weight of the solution. If the solid content in the solution is less than 10% by weight, since the use amount of the solvent is so much, it tends to be industrially disadvantageous. If it exceeds 70% by weight, the solubility of trimellitic anhydride is decreased and therefore it becomes difficult to carry out reaction sufficiently in some cases.

On completion of the above-mentioned reaction, an aromatic hydrocarbon azeotropic with water is added and reaction is further promoted at 150 to 200° C. for dehydration ring-closing reaction. Accordingly, an imido group-containing dicarboxylic acid can be obtained. Examples of the aromatic hydrocarbon azeotropic with water are toluene, benzene, xylene and ethylbenzene, however the aromatic hydrocarbon azeotropic with water is not limited to these examples. Among them, toluene is preferably used. Such an aromatic hydrocarbon is preferably added in an amount of 10 to 50% by weight to the weight of the non-proton polar solvent. If the addition amount of the aromatic hydrocarbon is less than 10% by weight to the weight of the non-proton polar solvent, the water removal effect tends to be insufficient and the production amount of the imido group-containing dicarboxylic acid also tends to be decreased. If it exceeds 50% by weight, the reaction temperature is decreased and the production amount of the imido group-containing dicarboxylic acid also tends to be decreased.

Further, in the dehydration ring-closing reaction, the aromatic hydrocarbon is sometimes distilled simultaneously with water, so that the aromatic hydrocarbon amount sometimes becomes less than the above-mentioned preferable range. Therefore, it is preferable to keep the aromatic hydrocarbon amount constant by separating the aromatic hydrocarbon distilled to the plug-equipped water quantitative receiver from water and then turning the aromatic hydrocarbon back. On completion of the dehydration ring-closing reaction, it is preferable to keep the temperature at 150 to 200° C. to remove the aromatic hydrocarbon azeotropic with water.

The imido group-containing dicarboxylic acid to be obtained by the above-mentioned reaction is preferably the compound defined by the following general formula (10). In the formula, G represents a residual group derived from the diamine defined by the general formulas (4a), (4b), (9), (6), (7a) or (7b) from which the amino group is removed. $R^1$ to $R^{16}$ and q, r, and s are same as defined above.

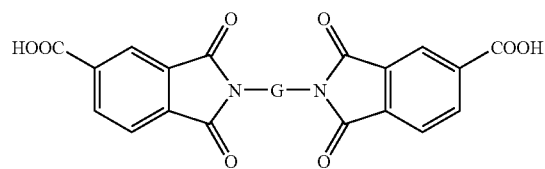

(10)

The polyamide imide used in the invention can be produced by inducing the above-mentioned imido group-containing dicarboxylic acid to acid halide and polymerizing the acid halide with the above-mentioned diamine compound.

In such a reaction, the imido group-containing dicarboxylic acid is easily led to the acid halide by thionyl chloride, phosphorus trichloride, phosphorus pentachloride, or dichloromethyl methyl ether. The imido group-containing dicarboxylic acid halide is easily polymerized with the above-mentioned diamine compound.

The polyamide imide used in the invention is produced by polymerizing the above-mentioned imido group-containing dicarboxylic acid with the above-mentioned diamine compound in the presence of a condensation agent.

In such a reaction, as the condensation agent, common condensation agents for forming amido bond can be used. For the condensation, particularly dicyclohexylcarbodiimide, diisopropylcarbodiimide, or N-ethyl-N'-3-dimethylaminopropylcarbodiimide is preferably used alone or in combination with N-hydroxysuccinimide or 1-hydroxybenzotriazole.

The polyamide imide used in the invention is produced also by converting the imido group-containing dicarboxylic acid into the acid halide and causing reaction of the acid halide with diisocyanate.

In such a reaction, diamine compound: trimellitic anhydride: diisocyanate is preferably in a range of 1: (2 to 2.2): (1 to 1.5) by mole and more preferably in a range of 1: (2 to 2.2): (1 to 1.3) by mole. A polyamide imide having a high molecular weight and advantageous in the film formability can be obtained by controlling the mole ratio in the above-mentioned range.

As the diisocyanate to be employed for the polyamide imide production method of the invention, a compound defined by the general formula (11) can be used.

OCN-D-NCO (11)

In the formula, D represents a divalent organic group having at least one aromatic ring or a divalent aliphatic hydrocarbon group. Practically, at least one group selected from —$C_6H_4$—$CH_2$—$C_6H_4$—, tolylene, naphthylene, hexamethylene, 2,2,4-trimethylhexamethylene, and isophorone group is preferable.

As the diisocyanate defined by the above-mentioned general formula (11), an aliphatic diisocyanate or an aromatic diisocyanate may be used. Among them, the aromatic diisocyanate is preferably used and combination use of both is more preferable.

Examples of the aromatic diisocyanate are 4,4'-diphenylmethane diisocyanate (MDI), 2,4-tolylene diisocyanate, 2,6-tolylene diisocyanate, naphthalene-1,5-diisocyanate, and 2,4-tolylene dimer, however the aromatic diisocyanate is not limited to these examples. Among them, MDI is preferably used. Use of MDI improves the flexibility of the polyamide imide to be obtained and decreases the crystallinity and accordingly improves the film formability of the polyamide imide.

Examples of the aliphatic diisocyanate are hexamethylene diisocyanate, 2,2,4-trimethylhexamethylene diisocyanate, and isophorone diisocyanate, however the aliphatic diisocyanate is not limited to these examples.

In the case the aromatic diisocyanate and the aliphatic diisocyanate are used in combination, the aliphatic diisocyanate is preferably added in an amount of 5 to 10% by mole to the aromatic diisocyanate. Such combination use further improves the heat resistance of the polyimide amide to be obtained.

The reaction of the imido group-containing dicarboxylic acid and diisocyanate is carried out by adding the diisocyanate to a solution containing the imido group-containing dicarboxylic acid obtained by the above-mentioned reaction and keeping the reaction temperature at 130 to 200° C.

In the case of using a basic catalyst, the reaction of the imido group-containing dicarboxylic acid and the diisocyanate is carried out preferably at 70 to 180° C. and more preferably at 120 to 150° C. In the case of the reaction in the presence of such a basic catalyst, the reaction can be carried out at a lower temperature than that of the reaction to be carried out in the absence of the basic catalyst. Therefore, the side reaction such as reaction of the diisocyanate molecules themselves can be suppressed and a polyamide imide with a further higher molecular weight can be obtained.

Examples of such a basic catalyst are trialkylamines such as trimethylamine, triethylamine, tripropylamine, tri(2-ethylhexyl)amine, and trioctylamine. Among them, triethylamine has a preferable basicity for reaction promotion and is easy to be removed after the reaction and therefore is preferable.

The polyamide imide to be obtained by the above-mentioned reaction comprises a repeating unit defined by the following general formula (12). In the formula, G represents a residual group derived from the diamine defined by the general formulas (4a), (4b), (9), (6), (7a) or (7b) from which the amino group is removed. $R^1$ to $R^{16}$ and q, r and s are same as defined above.

(12)

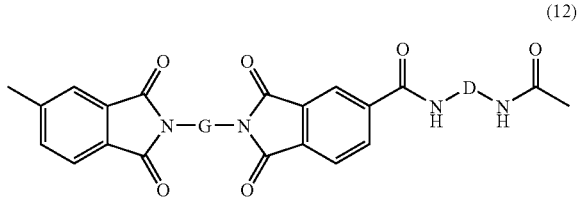

The polyamide imide obtained in such a manner as described above has a weight average molecular weight preferably 20,000 to 300,000, more preferably 30,000 to 200,000, and even more preferably 40,000 to 150,000. In this case, the weight average molecular weight is obtained by carrying out measurement by gel permeation chromatography and conversion based on the calibration curve produced by using standardized polystyrenes.

A thermosetting adhesive can be obtained by adding a functional group-containing amido-reactive compound to be reacted with the amido of the polyamide imide to the polyamide imide obtained in the above-mentioned manner.

The amido-reactive compound is a compound having a functional group to be reacted with the amido group of the polyamide imide by heating. As the amido-reactive compound, a polyfunctional epoxy compound and an oxetane compound can be exemplified, and the polyfunctional epoxy compound is preferably used.

Examples of the polyfunctional epoxy compound are bisphenol A type epoxy resin, tetrabromobisphenol A type epoxy resin, bisphenol F type epoxy resin, bisphenol S type epoxy resin, and biphenyl type epoxy resin, however the epoxy compound is not limited to these examples. One or more types of these exemplified compounds can be used.

The addition amount of the amido-reactive compound is preferably 10 to 40 parts by weight, more preferably 15 to 25 parts by weight to polyamide imide 100 parts by weight. If the addition amount of the amido-reactive compound is less than 10 parts by weight, the thermosetting property of the adhesive to be obtained tends to be deteriorated. If it exceeds 40 parts by weight, the cross-linked structure of the adhesive layer after curing the adhesive becomes dense and the brittle property of the resin tends to be decreased.

The above-mentioned adhesive is preferable to further contain a curing promoting agent. The curing promoting agent is a component to promote curing of the mixture of the polyamide imide and the amido-reactive compound and is preferably a compound promoting the curing of particularly the amido-reactive compound. Example of the curing promoting agent are amines and imidazoles, however the agent is not limited to them. One or more of these compounds can be used.

Examples of the amines are dicyandiamide, diaminodiphenylethane, and guanylurea, however the amines are not limited to these exemplified compounds. Examples of the imidazoles are alkyl-substituted imidazoles such as 2-ethyl-4-methylimidazole and benzoimidazole, however the imidazoles are not limited to these exemplified compounds.

The addition amount of such a curing promoting agent may be determined depending on the type of the amido-reactive compound. For example, in case that a polyfunctional epoxy compound is used as the amido-reactive compound and amines are used as the curing promoting agent, amines are preferably added in an amount to adjust the epoxy equivalent of the polyfunctional epoxy compound and the equivalent of the active hydrogen of the amino groups of the amines to be approximately same. In case that a polyfunctional epoxy compound is used as the amido-reactive compound, and imidazoles are used as the curing promoting agent, the imidazoles are preferably added in an amount of 0.1 to 2.0 parts by weight to the polyfunctional epoxy compound 100 parts by weight. If the addition amount of the curing promoting agent is insufficient, the uncured amido-reactive compound remains in the adhesive layer and the heat resistance of the adhesive layer tend to be decreased. If it is excessive, the curing promoting agent remains in the adhesive layer and the insulating property of the adhesive layer tends to be deteriorated after curing.

If necessary, the adhesive may contain a rubber type elastomer, a phosphorus type compound as a flame retardant, inorganic filler, a coupling agent, a pigment, a leveling agent, a defoaming agent, and an ion trapping agent.

An adhesion assisting agent prepared according to above descriptions is diluted with a solvent to obtain varnish, which is applied to one side of a copper foil. Examples of the organic solvent are ketones such as acetone, methyl ethyl ketone, and cyclohexanone; acetic acid esters such as ethyl acetate, butyl acetate, cellosolve acetate, propylene glycol monomethyl ether acetate, and carbitol acetate; cellosolves such as cellosolve and butyl cellosolve; carbitols such as carbitol and butylcarbitol; aromatic hydrocarbons such as toluene and xylene; dimethylformamide, dimethylacetamide, and N-methylpyrrolidone, however the solvent is not limited to these exemplified solvents. One or more kinds of these solvents may be used. The amount to be used for diluting with a adhesion assisting agent is not particularly limited, however, may be a conventionally know amount.

The adhesion assisting agent-bearing copper foil is completed by applying the adhesion assisting agent of the invention or the above-mentioned varnish to one face of a copper foil and semi-curing them.

In the case that the adhesion assisting agent as a varnish is applied to the copper foil with a comma coater, the amount of solvent used is preferably adjusted so as to control the total solid content of the adhesion assisting agent to be 40 to 70% by weight. Further, the amount may be adjusted depending on the facility for film formation.

An example of the production method of a substrate using the adhesion assisting agent-bearing metal foil as described will be described below. The adhesion assisting agent-bearing metal foil and prepreg are laminated and united by a conventionally known method to obtain a laminate plate as shown in FIG. 1(a).

Next, penetrating through holes 4 for interlayer connection are formed in the above-mentioned laminate body (FIG. 1(b)). If the through hole diameter is 100 μm or larger, drilling work is suitable. If the through hole diameter is 100 μm or narrower, gas laser of $CO_2$, CO, and excimer laser, and solid laser such as YAG laser are suitable to be employed. If the through hole diameter is around 100 μm, either method may be used.

Next, a catalyst core is supplied to the through hole insides. To supply the catalyst core, Activator Neoganth (trade name, manufactured by ATTO Tech Japan Co., Ltd.), a palladium ion catalyst, and HS 201B (trade name, manufactured by Hitachi Chemical Co., Ltd.), a palladium colloid catalyst can be used. In the case of supplying the palladium catalyst, conditioning treatment with such as CLC-201 (trade name, manufactured by Hitachi Chemical Co., Ltd.) is previously carried out.

Next, as shown in FIG. 1(c), a thin electroless plating layer 5 is formed on the metal foil and the through hole insides to which the catalyst core is supplied. For the electroless plating, commercialized electroless copper plating solutions such as CUST 2000 (trade name, manufactured by Hitachi Chemical Co., Ltd.) and CUST 201 (trade name, manufactured by Hitachi Chemical Co., Ltd.) can be employed, however the plating is not limited to these examples. These electroless copper plating solutions contain mainly copper sulfate, formalin, a complexing agent, and sodium hydroxide. The thickness of the plating is sufficient if the next electroplating can be carried out thereon and it is about 0.1 to 1 μm.

Next, as shown in FIG. 1(d), plating resist 6 is formed on the electroless plating. The thickness of the plating resist is preferably the same as or thicker than the thickness of a conductor for planting thereafter. Examples of the resin to be used for the plating resist are liquid phase resist such as PMER P-LA900PM (trade name; manufactured by Tokyo Ohka Kogyo Co., Ltd.) and dry films such as HW-425 (trade name, manufactured by Hitachi Chemical Co., Ltd.) and RY-3325 (trade name, manufactured by Hitachi Chemical Co., Ltd.). The plating resist should not be formed on the portions to be via holes and a conductor circuit.

Next, as shown in FIG. 1(e), circuit patterns 7 are formed by electroplating. A copper sulfate electroplating to be used commonly for a printed wiring board may be used. The thickness of the plating is sufficient if it is used as a circuit conductor and preferably in a range of 1 to 100 μm, and more preferably in a range of 5 to 50 μm.

Next, as shown in FIG. 1(f), the resist is separated by an alkaline separation solution, sulfuric acid, or a commercialized resist separation solution and copper in portions other than the pattern parts is removed by etching. In this case, etching is generally carried out by high pressure spraying or the like. However, the solution exchange deteriorates inevitably in the portions where the wiring is made fine. Accordingly, the reaction of the copper and the etching solution is desirably carried out based on the reaction speed, not on the diffusion speed. If the reaction of copper and the etching solution is carried out based on the reaction speed, even in the case where the diffusion is increased, the etching speed does not change. That is, no etching speed difference occures between the portions where the solution exchange is well promoted and the portions where the solution exchange is poorly promoted. Practically, an etching solution containing hydrogen peroxide and a halogen-free acid as the main components is preferably used. If hydrogen peroxide is used as an oxidizing agent, strict etching speed control is made possible by controlling the hydrogen peroxide concentration. Additionally, if a halogen element is added to the etching solution, the dissolution reaction tends to be promoted depending on the diffusion speed. As the halogen-free acid, nitric acid, sulfuric acid, and organic acids are usable and sulfuric acid is economical and therefore preferable. In the case that the etching solution contains sulfuric acid and hydrogen peroxide as the main components, their concentrations are preferable to be 5 to 300 g/L and 5 to 200 g/L, respectively, in terms of the etching speed and the stability of the solution.

Accordingly, the method for producing a substrate by the pattern-wise electroplating method is described above, however a subtractive method may be employed. By the method described above, a core substrate comprising two layers is completed. The core substrate produced in the above-mentioned manner is preferable to have the surface roughness Rz of the conductor circuit 2.0 μm or lower and the surface roughness Rz of the insulating layer 2.0 μm or lower in terms of the electric properties.

The conductor circuit and the insulating layer formed as described above are smooth. Therefore, to firmly bond these layers, as shown in FIG. 1(g), an adhesion assisting agent layer 8 for promoting the adhesion strength may be formed. In consideration of reliability, formation of the adhesion assisting agent layer is preferable. The thickness of the adhesion assisting agent layer is preferably in a range of 0.1 to 10 μm and further preferably 0.1 to 5 μm. If the thickness of the adhesion assisting agent layer is thinner than 0.1 μm, the adhesion strength sometimes becomes insufficient. If the thickness is thicker than 10 μm, adverse effects on various properties such as elongation, dielectric constant, dielectric dissipation factor and the like are caused in some cases. The composition of the adhesion assisting agent may be similar to the resin used for applying the copper foil in step (a).

If the conductor circuit surface is subjected to anti-rust treatment with nickel, chromium, tin, zinc or palladium and to treatment with a coupling agent and then the adhesion assisting agent layer is formed thereon, the peeling strength is improved. The methods for the anti-rust treatment and the treatment with a coupling agent may be the same as those employed in the case where a copper foil is used. The anti-rust treatment is preferably carried out by electroless plating.

The coating method for the adhesion assisting agent layer is carried out by immersing the core substrate in an adhesion assisting agent solution. Before the immersion, the substrate may be immersed in an acid, an alkali, or various surfactant solutions to remove the oxidized layer or improve the wettability. The surface roughness Rz of the conductor circuit after the film formation is desirably 2.0 μm or lower. The concentration of the solid content of the adhesion assisting agent is not particularly limited, however it is preferably in a range of 1 to 50%, more preferably in a range of 3 to 25% in consideration of the resin thickness after immersion. The adhesion assisting agent treatment temperature may be a at room temperature and the solution temperature may be controlled in a range of 10 to 50° C.

After the immersion, drying is carried out by blowing hot air. The drying temperature is preferably in a range of 90 to 210° C. and more preferably 120 to 190° C. The solvent remaining after drying is controlled to be 1% or less. If the remaining solvent is higher than 1%, the reliability of the printed wiring board to be finally produced is sometimes deteriorated. The drying duration differs depending on the drying temperature, however it is 1 minute to 60 minutes. The resin after drying is kept in the B-stage state, which is a semi-cured state, but not completely cured. If the resin is completely cured, the adhesion strength to the insulating layer to be formed thereon may possibly be weak.

Next, as shown in FIG. 1(h), a one side metal foil-bearing resin comprising an insulating layer 9 and a metal layer 10 is laminated on the core substrate treated with the adhesion assisting agent. An adhesion assisting agent layer 11 may be formed between the insulating layer 9 and the metal layer 10. The resin thickness of the insulating layer is about 10 to 100 μm, preferably 20 to 60 μm. The thickness of the foil 10 is preferably 0.3 to 3 μm. The same resin and the copper foil that was used for producing the one-side metal foil-bearing resin may be used. The metal foil-bearing resin may be obtained by applying a resin varnish to the metal foils by using a kiss coater, a roll coater, or a comma coater. Or, the metal foil-bearing resin may be obtained by laminating a film-like resin on the metal foil. In the case that the resin varnish is applied to the metal foil, the resulting laminate is heated and dried thereafter. The conditions for heating and drying are 100 to 200° C. for 1 to 30 minutes. The amount of remaining solvent in the resin composition after that the heating and drying is preferably 0.2 to 10%. In the case that the film-like resin is laminated onto the metal foil, the conditions are preferably at 50 to 150° C. and 0.1 to 5 MPa vacuum or atmospheric pressure. The addition of the epoxy resin to the insulating layer improves the adhesion strength to the polyamide imide in the B stage. Further, there is a laminating and pressing method for the core substrate, prepreg, and copper foils. In the case the core substrate and prepreg and the copper foil are laminated and pressed, the prepreg to be used is produced by the same method as the method for the core substrate. The peeling strength between the adhesion assisting agent layer and the copper foil is preferably 0.6 kN/m or higher if the peeling strength of the adhesion assisting agent-bearing insulating layer and the conductor circuit with 1 mm width at 20° C. is measured, and more preferably 0.4 kN/m or higher if the peeling strength of the adhesion assisting agent-bearing insulating layer and the conductor circuit with 1 mm width at 20° C. after the laminate is kept at 150° C. for 240 hours is measured.

Next, IVH 12 is formed in the inter resin insulating layer from the metal foil as shown in FIG. 1(i). For the IVH formation method, laser is preferably used. As the laser to be employed in this case, gas laser of $CO_2$, CO, and excimer laser, and solid laser such as YAG laser are available. Since $CO_2$ laser easily gives a high output, it is suitable for processing IVH with ϕ50 μm or larger. In the case of processing fine IVH with ϕ50 μm or smaller, YAG laser is suitable since it has a shorter wavelength and has excellent light converging property.

Conformal hole formation can be employed for IVH formation. In this case, a window hole is formed in the copper foil by a photolithographic method and carrying out IVH formation by laser with a larger laser diameter than that of the window hole. In this case, use of the adhesion assisting agent of the invention is effective to improve the plating deposition on the portions (end parts of the substrate) where the resin is naked. Therefore, the problem of separation of the plating in the end parts of the substrate scarcely takes place.

Next, the resin residue in the inside of the IVH is removed by using an oxidizing agent such as permanganic acid salt, chromic acid salt, or chromic acid.

Next, as shown in FIG. 1(j), a thin electroless plating layer 13 is formed on the metal foil and IVH inside to which the catalyst core is supplied. For the electroless plating, commercialized electroless copper plating solutions such as CUST 2000 (trade name, manufactured by Hitachi Chemical Co., Ltd.) and CUST 201 (trade name, manufactured by Hitachi Chemical Co., Ltd.) can be employed, however the plating is not limited to the examples. These electroless copper plating solutions contain mainly copper sulfate, formalin, a complexing agent, and sodium hydroxide. The thickness of the plating is sufficient if the next electroplating can be carried out thereon and it is about 0.1 to 1 μm.

Next, as shown in FIG. 1(k), plating resist 14 is formed on the electroless plating layer. The thickness of the plating resist is preferably the same as or thicker than the thickness of a conductor for planting thereafter. Examples of the resin to be used for the plating resist are liquid phase resist such as PMER P-LA900PM (trade name; manufactured by Tokyo Ohka Kogyo Co., Ltd.) and dry films such as HW-425 (trade name, manufactured by Hitachi Chemical Co., Ltd.) and RY-3325 (trade name, manufactured by Hitachi Chemical Co., Ltd.). The plating resist should not be formed on the portions to be via holes and a conductor circuit.

Next, as shown in FIG. 1(l), circuit patterns 15 are formed by electroplating. A copper sulfate electroplating used commonly for a printed wiring board may be used. The thickness of the plating is sufficient if it is used as a circuit conductor and preferably in a range of 1 to 100 μm, more preferably in a range of 5 to 50 μm.

Next, the resist is separated by an alkaline separation solution, sulfuric acid, or a commercialized resist separation solution.

Next, copper in the portions other than the pattern parts is removed by an etching solution to complete circuit formation (FIG. 1(m)). For the etching solution, those which contain sulfuric acid in a concentration of 10 to 300 g/L and hydrogen peroxide in a concentration of 10 to 200 g/L as main components are preferable.

Further, a gold plating layer 16 may be carried out on the circuit by electroless gold plating (FIG. 1(n)). As a gold plating method, steps may be carried out as follows: the conductor interface is activated by an activation solution such as SA-100 (trade name; manufactured by Hitachi Chemical Co., Ltd.); electroless nickel plating with a thickness of 1 to 10 μm is carried out by using NIPS-100 (trade name; manufactured by Hitachi Chemical Co., Ltd.); replacement gold plating with a thickness of 0.01 to 0.1 μm is carried out by using HGS-100 (trade name; manufactured by Hitachi Chemical Co., Ltd.); and then electroless gold plating with a thickness of about 0.1 to 1 μm is carried out by using HGS-2000 (trade name; manufactured by Hitachi Chemical Co., Ltd.). Further, if electroless palladium plating is carried out between the electroless nickel plating and electroless gold plating as described in JP-A No. 11-140659, the connection reliability is further improved. As a reference, the subject matter of the mentioned JP-A No. 11-140659 is hereby incorporated herein by reference. The electroless palladium plating may be carried out in 0.01 to 1 μm thickness by using Pallet (trade name; KOJIMA Chemical Co., Ltd.). In consideration of the electric properties, the electroless nickel plating may be eliminated. These combinations may differ depending on the uses of the product and determined based on the cost, electric properties, and connection reliability. The invention is effective in cases where any of the above-mentioned techniques are employed.

In place of the electroless gold plating, printing of solder resist as permanent resist may be carried out (FIG. 1(n)). The solder resist 16 may be formed on portions which are not needed for mounting by printing it on the wiring and insulating layer and carrying out exposure and development. As the solder resist, PSR-4000 (trade name; Taiyo Ink Mfg. Co., Ltd.) may be used. Here, the adhesion strength of the solder resist and the insulating layer in C stage sometimes becomes a problem, however the adhesion property is improved in the invention since the adhesion assisting agent layer exists. The printed wiring board of the embodiment of the invention comprises the adhesion assisting agent layer and therefore is excellent in moisture absorption resistance and heat resistance and undesirable problems in reflowing treatment or the like to be carried out thereafter hardly occur.

Hereinafter, the invention will be described more practically.

EXAMPLE 1

The following metal foil A was produced.

(Metal Foil A)

Chromium plating was continuously carried out on the bright face of an electrolytic copper foil (a carrier copper foil) with a width of 510 mm and a thickness of 35 μm in the following conditions to form a chromium plating layer (a separation layer) with a thickness of 1.0 mg/dm². The surface roughness (ten-point mean surface roughness) Rz after the chromium plating formation was 0.5 μm. The surface roughness was measured according to JIS-B-0601.

Chromium Plating Conditions

Solution composition: chromium trioxide 250 g/L and sulfuric acid 2.5 g/L,
Bath temperature: 25° C.,
Anode: lead, and
Electric current density: 20 A/dm$^2$.

Next, electric copper plating in a thickness of 2.0 μm was carried out in the following bright conditions. The metal foil surface roughness Rz after the electric copper plating was 0.6 μm.

Electric Copper Plating Conditions

Solution composition: copper sulfate pentahydrate 100 g/L, sulfuric acid 150 g/L, and chloride ion 30 ppm,
Bath temperature: 25° C.,
Anode: lead, and
Electric current density: 10 A/dm$^2$.

Next, zinc anti-rust treatment was carried out by electric plating in the following bright conditions.
Solution composition: zinc 20 g/L and sulfuric acid 70 g/L,
Bath temperature: 40° C.,
Anode: lead,
Electric current density: 15 A/dm$^2$.
Electrolytic time: 10 seconds.

Next, successively the following chromate treatment was carried out.
Solution composition: chromic acid 5.0 g/L,
pH: 11.5,
Bath temperature: 55° C.,
Anode: lead, and
Immersion period: 5 seconds.

Next, the following silane coupling treatment was carried out.
Solution composition: 3-aminopropyltrimethoxysilane 5.0 g/L,
Bath temperature: 25° C., and
Immersion period: 10 seconds.

After silane coupling treatment, the metal foil was dried at 120° C. to adsorb the coupling agent to the metal foil surface to obtain a metal foil A. The metal foil surface roughness Rz was 0.6 μm at that time.

A resin composition A was produced as follows. The resin composition A was used as an adhesion assisting agent in a step thereafter.

A resin composition B was produced as follows. The resin composition B is used for an insulating layer in a step thereafter.

(Resin Composition B)

Polyphenylene ether resin (trade name: PKN 4752, manufactured by GE Plastics Japan Co., Ltd.) 20% by weight, 2,2-bis(4-cyanatophenyl)propane (trade name: AcrocyB-10, manufactured by Asahi-Ciba Ltd.) 40% by weight, phosphorus-containing phenol compound (trade name: HCA-HQ, manufactured by Sanko Co., Ltd.) 8% by weight, manganese naphthenate (Mn content=6% by weight, manufactured by Nihon Kagaku Sangyo Co., Ltd.) 0.1% by weight, and 2,2-bis(4-glycidylphenyl)propane (trade name: DER331L, Dow Chemical Corp. Japan) 32% by weight were dissolved in toluene by heating at 80° C. to produce polyphenylene ether cyanate type resin composition varnish.

The metal foil B was produced as follows. The metal foil B was an adhesion assisting agent-bearing metal foil obtained by applying the resin composition A, which was an adhesion assisting agent, to a metal foil A.

(Metal Foil B)

The resin composition A, which was an adhesion assisting agent, was applied to the silane coupling agent-treated face of a metal foil A. After the application, drying was carried out at 160° C. for 1 minute so as to suppress the remaining solvent to 11% or less and obtain the metal foil B. The thickness of the applied resin composition A was 2.0 μm.

Next, a 0.2 mm thick glass cloth (basic weigh 210 g/m$^2$) was impregnated with the resin composition B and dried at 120° C. for 5 minutes to obtain prepreg. Four sheets of the prepreg and sheets of the metal foil B were laminated in such a manner that the faces coated with the resin composition A were brought into contact with the prepreg in the top face and bottom face, and then the obtained laminate was press-formed at 170° C. and 2.45 MPa for 1 hour. The carrier foil on the copper foil was peeled to obtain a copper-clad laminate board comprising the prepreg 1, the adhesion assisting agent layer 3, and the metal foil 2 as shown in FIG. 1(*a*).

As shown in FIG. 1(*b*), penetrating through holes 4 with a diameter 80 μm were formed in the metal foil by a carbon dioxide gas impact laser drilling apparatus L-500 (trade name, manufactured by Sumitomo Heavy Industries, Ltd.). Next, the resulting prepreg was immersed in an aqueous solution mixture of potassium permanganate 65 g/l and sodium hydroxide 40 g/l at 70° C. for 20 minutes to remove smear.

| (Resin composition A) | |
|---|---|
| Novolak type epoxy resin having biphenyl structure, NC 3000S-H (manufactured by Nippon Kayaku Co., Ltd.) | 80 parts by weight |
| Carboxylic acid-modified acrylonitrile-butadiene rubber particles, XER-91SE-15 (manufactured by JSR Co., Ltd.) | 5 parts by weight |
| Triazine ring-containing cresol novolak type phenol resin, Phenolite EXB-9829 (nitrogen content 18% by weight, hydroxyl equivalent 151, manufactured by Dainippon Ink and Chemicals Inc.) | 9 parts by weight |
| Phenolic hydroxyl group-containing phosphorus compound, HCA-HQ (manufactured by Sanko Co., Ltd.) | 26 parts by weight |
| Inorganic filler, spherical silica, Admafine SC-2050 (manufactured by Admatechs Co., Ltd.) | 40 parts by weight |
| Imidazole derivative compound, 1-cyanoethyl-2-phenylimidazolium trimellitate, 2PZ-CNS (manufactured by Shikoku Corp.) | 0.24 parts by weight |
| Solvent, methyl ethyl ketone | |

After that, HS-201B, a palladium catalyst (trade name, manufactured by Hitachi Chemical Co., Ltd.), was supplied. After that, using CUST 201 (trade name, manufactured by Hitachi Chemical Co., Ltd.), electroless copper plating was carried out at 25° C. for 30 minutes to form a 0.5 μm-thick electroless copper plating layer 5 as shown in FIG. 1(c). The palladium catalyst supply conditions are shown in Table 1.

TABLE 1

| Treatment Step | Treatment Solution | Treatment Condition |
|---|---|---|
| Cleaner | CLCc-501 | 60° C., 5 min |
| Warm Water Washing | Pure Water | 40° C., 4 min |
| Etching | Ammonium Peroxodisulfate 187 g/l | 25° C., 10 sec. |
| Flowing Water Washing | Pure Water | 25° C., 3 min. |
| Acid Treatment | 10 Vol. % Sulfuric Acid | 25° C., 3 min. |
| Flowing Water Washing | Pure Water | 25° C., 2 min. |
| Catalyst Supply Pretreatment | PD301 | 25° C., 2 min. |
| Catalyst Supply Treatment | HS201-B | 25° C., 8 min. |
| Flowing Water Washing | Pure Water | 25° C., 3 min. |
| Adhesion Promoting Agent | ADP-201 | 25° C., 4 min. |
| Flowing Water Washing | Pure Water | 25° C., 2 min. |

As shown in FIG. 1(d), RY-3325, a dry film photoresist (trade name, manufactured by Hitachi Chemical Co., Ltd.), was laminated on the surface of the electroless plating layer. Next, the portions to be coated with electrolytic copper plating were masked with a photomask and UV exposure and development were carried out to form plating resist 6.

As shown in FIG. 1(e), electrolytic copper plating 20 μm was carried out in conditions of 25° C. bath temperature and 1.0 A/dm$^2$ current density in a copper sulfate bath to form circuit patterns 7 with the minimum circuit conductor width/circuit conductor interval (L/S)=23/17 μm.

Next, as shown in FIG. 1(f), the dry film was removed by HTO (trade name, manufactured by Nichigo-Morton Co., Ltd.). After that, copper in the portions other than the pattern parts was removed by etching with an etching solution with a composition of $H_2SO_4$ 100 g/L and $H_2O_2$ 10 g/L to obtain a core substrate. The surface roughness Rz of the insulating layer of the core substrate was 0.5 μm. The surface roughness Rz of the conductor circuit was 1.2 μm. The surface roughness was measured according to JIS-B-0601.

Next, after 1 μm-thick electroless nickel plating was carried out on the surface of the conductor circuit, the following silane coupling treatment was carried out.
Solution composition: 3-aminopropyltrimethoxysilane 5.0 g/L;
Solution temperature: 25° C.
Immersion time: 10 seconds Next, the whole body of the substrate was immersed in the solution of the resin composition A, pulled out of the solution, and dried at 160° C. for 10 minutes to suppress the remaining solvent 1% or less and as shown in FIG. 1(g), the whole body of the substrate was coated with the resin composition A to form an adhesion assisting agent layer 8. The thickness of the coating was about 2 μm after drying.

The prepreg impregnated with the composition B which has a thickness of 60 mμ and the metal foil B were laminated on the core substrate after the coating. Next, the resulting laminate was press-formed at 170° C. and 2.45 MPa for 1 hour and the carrier foil on the copper foil was peeled to produce a substrate on which the insulating layer 9, the adhesion assisting agent layer 11, and a metal foil 10 were formed as shown in FIG. 1(h).

As shown in 1I, IVHs 12 with a diameter of 50 μm were formed in the metal foil by a carbon dioxide gas impact laser drilling apparatus L-500 (trade name, manufactured by Sumitomo Heavy Industries, Ltd.). Next, the resulting substrate was immersed in an aqueous solution mixture of potassium permanganate 65 g/l and sodium hydroxide 40 g/l at 70° C. for 20 minutes to remove smear.

After that, HS-201B, a palladium catalyst (trade name, manufactured by Hitachi Chemical Co., Ltd.), was supplied. After that, using CUST 201 (trade name, manufactured by Hitachi Chemical Co., Ltd.), electroless copper plating was carried out at 25° C. for 30 minutes to form a 0.5 μm-thick electroless copper plating layer 13 as shown in FIG. 1(j). The palladium catalyst supply conditions are shown in Table 2.

TABLE 2

| Treatment Step | Treatment Solution | Treatment Condition |
|---|---|---|
| Cleaner | CLCc-501 | 60° C., 5 min |
| Warm Water Washing | Pure Water | 40° C., 4 min |
| Etching | Ammonium Peroxodisulfate 187 g/l | 25° C., 10 sec. |
| Flowing Water Washing | Pure Water | 25° C., 3 min. |
| Acid Treatment | 10 Vol. % Sulfuric Acid | 25° C., 3 min. |
| Flowing Water Washing | Pure Water | 25° C., 2 min. |
| Catalyst Supply Pretreatment | PD301 | 25° C., 2 min. |
| Catalyst Supply Treatment | HS201-B | 25° C., 8 min. |
| Flowing Water Washing | Pure Water | 25° C., 3 min. |
| Adhesion Promoting Agent | ADP-201 | 25° C., 4 min. |
| Flowing Water Washing | Pure Water | 25° C., 2 min. |

As shown in FIG. 1(k), RY-3325, which is a dry film photoresist (trade name, manufactured by Hitachi Chemical Co., Ltd.), was laminated on the surface of the electroless plating layer. Next, the portions to be coated with electrolytic copper plating were masked with a photomask and UV exposure and development were carried out to form plating resist 14.

As shown in FIG. 1(i), electrolytic copper plating 20 μm was carried out in conditions of 25° C. bath temperature and 1.0 A/dm$^2$ current density in a copper sulfate bath to form circuit patterns 15 with the minimum circuit conductor width/circuit conductor interval (L/S)=23/17 μm.

Next, as shown in FIG. 1(m), the dry film was removed by HTO (trade name, manufactured by Nichigo-Morton Co., Ltd.). After that, copper in the portions other than the pattern parts was removed by etching with an etching solution of a composition of $H_2SO_4$ 100 g/L and $H_2O_2$ 10 g/L. The minimum circuit conductor width/circuit conductor interval (LIS) after etching was 20/20 μm.

Next, as shown in FIG. 1(n), electroless gold plating was formed on the outermost layer to form a gold plating layer 16 and obtain a printed wiring board. The electroless gold plating conditions are shown in Table 3.

TABLE 3

| Step | Solution | Concentration | Solution Temperature | Immersion Time |
|---|---|---|---|---|
| Degreasing | Z-200 | | 60° C. | 1 min. |
| Water Washing | | | 25° C. | 2 min. |
| Soft Etching | Ammonium Peroxodisulfate | 100 g/L | 25° C. | 1 min. |

TABLE 3-continued

| Step | Solution | Concentration | Solution Temperature | Immersion Time |
|---|---|---|---|---|
| Water Washing | | | 25° C. | 2 min. |
| Acid Washing | Sulfuric Acid | 10 vol % | 25° C. | 1 min. |
| Water Washing | | | 25° C. | 2 min. |
| Activation Treatment | SA-100 | | 25° C. | 5 min. |
| Water Washing | | | 25° C. | 2 min. |
| Electroless Nickel Phosphorus Plating | NIPS-100 | | 85° C. | 20 min. |
| Water Washing | | | 25° C. | 2 min. |
| Electroless Nickel Boron Plating | Top Chemi Alloy 66 | | 65° C. | 5 min. |
| Water Washing | | | 25° C. | 2 min. |
| Electroless Nickel Palladium Plating | Pallet | | 70° C. | 5 min. |
| Water Washing | | | 25° C. | 2 min. |
| Displacement Gold Plating | HGS-100 | | 85° C. | 10 min. |
| Water Washing | | | 25° C. | 2 min. |
| Electroless Gold Plating | HGS-2000 | | 65° C. | 40 min. |

Remarks)

Z-200 (trade name: manufactured by World Metal Co., Ltd.)

SA-100 (trade names; manufactured by Hitachi Chemical Co., Ltd.)

NIPS-100 (trade names; manufactured by Hitachi Chemical Co., Ltd.)

Top Chemi Alloy 66 (trade names; manufactured by Okuno Chemical Industries Co., Ltd.)

Pallet (trade name; KOJIMA Chemicals Co., Ltd.)

HGS-100 (trade names; manufactured by Hitachi Chemical Co., Ltd.)

HGS-2000 (trade names; manufactured by Hitachi Chemical Co., Ltd.)

EXAMPLE 2

A printed wiring board was produced in the same manner as Example 1, except that at the time of producing the resin composition A, the addition amount of the novolak type epoxy resin having biphenyl structure (NC3000S-H) was changed to 82.8 parts by weight from 80 parts by weight and the addition amount of the cresol novolak type phenol (Phenolite EXB-9829) was changed to 12.2 parts by weight from 9 parts by weight.

EXAMPLE 3

A printed wiring board was produced in the same manner as Example 1, except that the thickness of the resin composition A was changed to 5 μm from 2.0 μm at the time of producing the metal foil B.

EXAMPLE 4

A printed wiring board was produced in the same manner as Example 1, except that the silane coupling treatment solution used for the silane coupling treatment of the metal foil A was changed to 3-glycidoxypropyltrimethoxysilane from 3-aminopropyltrimethoxysilane.

EXAMPLE 5

A printed wiring board was produced in the same manner as Example 1, except that at the time of producing the resin composition A, butadiene rubber-acrylic resin core shell particles, EXL-2655 (manufactured by Kureha Chemical Industry Co., Ltd.) 10 parts by weight were used in place of the carboxylic acid-modified acrylonitrile-butadiene rubber particles 5 parts by weight.

EXAMPLE 6

A printed wiring board was produced in the same manner as Example 1, except that 60 μm-thick prepreg, GEA-679-FG (trade name, manufactured by Hitachi Chemical Co., Ltd.), was used in place of the prepreg obtained from the resin composition B in step (G) in Example 1.

EXAMPLE 7

A printed wiring board was produced in the same manner as Example 1, except that the thickness of the resin composition A was changed to 8 μm from 2 μm at the time of producing the metal foil B.

COMPARATIVE EXAMPLE 1

A printed wiring board was produced in the same manner as Example 1, except that the metal foil A was laminated in place of laminating the prepreg impregnated with the composition B and the metal foil B, on the core substrate after coating with the resin composition A in step (G) in Example 1.

(Measurement of the Peeling Strength of the Conductor)

The peeling strength of the conductor of the printed wiring boards (samples) of Examples 1 to 7 and Comparative Example 1 was measured. The peeling strength measurement was carried out by measuring the vertical peeling strength. The initial values and values of the peeling strength after heating at 150° C. for 240 hours were measured. The measurement was carried out constantly at 20° C. The measurement conditions are shown in Table 4.

TABLE 4

Test Conditions for Conductor Circuit Peel Strength

| Item | Condition |
|---|---|
| Apparatus | Autograph AC-100C, manufactured by Shimadzu Corporation |
| Peeling Speed | 50 mm/min. |
| Test Width | 1 mm |

(Moisture Absorption Heating Resistant Test)

The samples of Examples 1 to 7 and Comparative Example 1 were subjected to the test of moisture absorption and heating resistance. Practically, the respective samples were treated at 121° C. and 100% humidity in 2 atmospheric pressure for 96 hours. A saturation type PCT apparatus PC-242 manufactured by Hirayama Mfg. Corp. was employed.

After that, whether blisters had formed in the samples or not was confirmed. Also, the peeling strength of the conductors of the samples was measured at 20° C.

(Evaluation of Connection Reliability)

Figure 2:
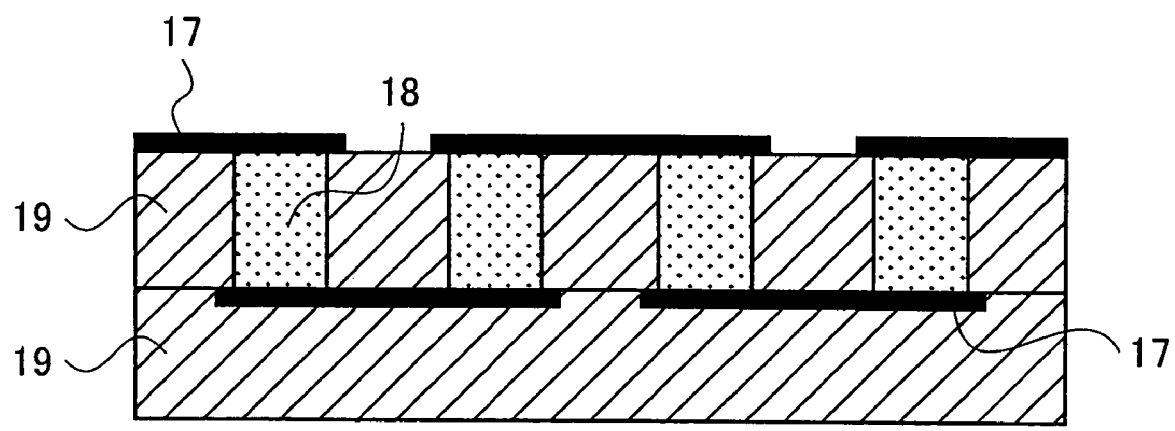
FIG. 2 is a cross-sectional view of a sample used in Example for connection reliability evaluation.

The connection reliability of the printed wiring boards of Examples 1 to 7 and Comparative Example 1 was evaluated. The connection reliability evaluation was carried out by using the patterns shown in FIG. 2. The patterns in FIG. 2 include the conductor circuit 17, IVH 18, and the insulating layer 19. The design of the patterns shown in FIG. 2 is shown in Table 5. The connection reliability was evaluated as follows: one cycle comprised holding at −65° C. for 30 minutes and at 125° C. for 30 minutes, if the resistance value alteration was within ±10% of the initial value after 1000 cycles, the sample was qualified.

TABLE 5

Design of Connection Reliability Evaluation Pattern

|  | Unit | Employed |
| --- | --- | --- |
| IVH Diameter | μm | 80 |
| IVH Pitch | mm | 1.27 |
| Inner Layer Pad Diameter | μm | 150 |
| Outer Layer Land Diameter | μm | 150 |
| IVH Number | holes | 400 |

(Test Results)

The test results are shown in Table 6. With respect to Examples 1 to 7, the conductor peeling strength was found 0.7 kN/m or higher for all of the initial value, the value after 150° C. for 240 hours, and the value after the moisture absorption heating resistance test. Also, no blister was observed after the moisture absorption heating resistance test.

On the other hand, with respect to Comparative Example 1, the conductor peeling strength was weak and blisters occurred between the inner conductor and the insulating layer after the moisture absorption heating resistance test. Also, a good result was not obtained in the connection reliability.

EXAMPLE 8

A copper-clad laminate board was produced by using 0.6 mm-thick prepreg GE-679-FG (trade name, manufactured by Hitachi Chemical Co., Ltd.) in place of the obtained prepreg in step A in Example 1. A printed wiring board shown in FIG. 1(*n*) was also produced in the same manner as Example 1, except that no silane coupling treatment was carried out after the core substrate production and the adhesion assisting agent layer 8 was formed by immersing the whole body of the substrate in the resin composition C in place of execution of the silane coupling treatment after the core substrate production method and formation of the adhesion assisting agent layer 8 by immersion of the whole body of the substrate in the resin composition in steps F and G; and a photosensitive solder resist PSR-400 (trade name; Taiyo Ink Mfg. Co., Ltd.) was applied and exposure and development were carried out in place of the formation of the gold plating layer 16 by electroless gold plating in step N.

The resin composition C was produced as follows. The resin composition C was an adhesion assisting agent.

(Resin Composition C)

A separable flask of 500 mL capacity equipped with a Deen/Stark refluxing cooling apparatus, a thermometer, and a stirrer was loaded with (4,4'-diamino)dicyclohexylmethane as an alicyclic diamine compound (trade name: Wondamine HM (abbreviated as WHM), manufactured by New Japan Chemical Co., Ltd.) 45 mmol, a reactive silicone oil X-22-161-B as siloxanediamine (trade name, manufactured by Shin-Etsu Chemical Co., Ltd., amine equivalent 1,500) 5 mmol, trimellitic anhydride (TMA) 105 mmol, and N-methyl-2-pyrrolidone (NMP) as a non-proton polar solvent 145 g and the mixture was stirred at 80° C. for 30 minutes.

On completion of stirring, toluene 100 mL as an aromatic hydrocarbon azeotropic with water was added and the resulting reaction solution was heated to 160° C. and refluxed for 2 hours. When it was confirmed that a theoretical quantity of water was pooled in a water quantitative reception apparatus and no water flow was observed, water and toluene in the water quantitative reception apparatus were removed and toluene in the reaction solution was removed by heating to 190° C.

After the solution in the flask was cooled to room temperature, 4,4'-diphenylmethane diisocyanate (MDI) as diisocyanate 60 mmol was added and the temperature was heated to 190° C. and reaction was carried out for 2 hours to obtain an NMP solution of polyamide imide resin. Next, YDCN-500-10 (manufactured by Tohto Kasei Co., Ltd.) as an epoxy resin

TABLE 6

| | Conductor peeling strength (kN/m) | | | Blister | |
| --- | --- | --- | --- | --- | --- |
| | Initial | After 150° C. for 240 hours | After the moisture absorption heating resistance test | After the moisture absorption heating resistance test | Connection reliability |
| Example 1 | 1.2 | 1.1 | 1 | None | Good |
| Example 2 | 1.2 | 1.1 | 1 | None | Good |
| Example 3 | 1.3 | 1.2 | 1.1 | None | Good |
| Example 4 | 1.1 | 0.9 | 0.9 | None | Good |
| Example 5 | 1.2 | 1.1 | 1.1 | None | Good |
| Example 6 | 1.2 | 1.1 | 1.1 | None | Good |
| Example 7 | 1.3 | 1.2 | 1.1 | None | Good |
| Comparative Example 1 | 0.3 | 0.3 | 0.2 | Occurring | Poor | was added in an amount so as to adjust the total solid content concentration to be 10%, and further 2-ethyl-4-methylimidazole as a curing promoting agent was added in an amount of 1% by weight on the basis of the solid content of the epoxy resin and the resulting solution was diluted with dimethylacetamide to obtain thermosetting resin varnish (solid content 10%).

EXAMPLE 9

A substrate was produced in the same manner as Example 1, except that about 3 μm roughness was formed by etching the conductor circuit, in place that the coating of the whole body of the substrate with the resin composition C by immersing the whole body of the substrate in the solution of the resin composition C, pulling the substrate out of the solution, and drying at 160° C. for 10 minutes to suppress the remaining solvent to 1% or less in step G. CZ treatment (trade name, manufactured by Mech & Co., Ltd.) was used for the etching.

EXAMPLE 10

A substrate was produced in the same manner as Example 8, except that the thickness of the resin composition A was changed to 5 μm from 2 μm in the case of producing the metal foil B.

COMPARATIVE EXAMPLE 2

A substrate was produced in the same manner as Example 8, except that the metal foil A was laminated on the core substrate after coating, in place of laminating the prepreg impregnated with the composition B and metal foil B in step (h) in Example 8.

(Moisture Absorption Heating Resistant Test)

The samples of Examples 8 to 10 and Comparative Example 2 were subjected to the test of moisture absorption and heating resistance. The respective printed wiring boards (samples) were treated at 121° C. and 100% humidity at a pressure of 2 atm for 96 hours. After that whether blister occurred or not in the substrates was confirmed. A saturation type PCT apparatus PC-242 manufactured by Hirayama Mfg. Corp. was employed for the test.

(Moisture Absorption Soldering Test)

The samples of Examples 8 to 10 and Comparative Example 2 were subjected to the test of moisture absorption soldering. The test of the substrates were carried out by treating the respective samples at 121° C. and 100% humidity at a pressure of 2 atm for 1 hour and then immersing them in a solder bath at 288° C. After that whether blister occurred or not in the substrates was confirmed. A saturation type PCT apparatus PC-242 manufactured by Hirayama Mfg. Corp. was employed for the test.

(Test Results)

The test results of the samples produced in Examples 8 to 10 and Comparative Example 2 are shown in Table 7. As shown in Table 7, no abnormality was observed in the samples produced in Examples 8 to 10 since they had the adhesion assisting agent layer, meanwhile blisters were observed between the substrate and the solder resist in the wiring board produced in Comparative Example 2.

TABLE 7

| | Moisture absorption heating resistant test | Moisture absorption soldering test |
|---|---|---|
| Example 8 | No abnormality | No abnormality |
| Example 9 | No abnormality | No abnormality |
| Example 10 | No abnormality | No abnormality |
| Comparative Example 2 | Blistering in resin—resin layers | Blistering in resin—resin layers |

What is claimed is:

1. An adhesion assisting agent-bearing metal foil comprising a layer of an adhesion assisting agent containing an epoxy resin as an indispensable component on a metal, wherein the adhesion assisting agent layer has a thickness of 0.1 to 10 μm, and wherein the agent containing an epoxy resin as an indispensable component contains (A) an epoxy resin, (B) rubber particles, and (C) an epoxy resin curing agent.

2. The adhesion assisting agent-bearing metal foil according to claim 1, wherein the component (A) is a novolak epoxy resin or contains a novolak epoxy resin.

3. The adhesion assisting agent-bearing metal foil according to claim 2, wherein the component (A) has a biphenyl structure.

4. The adhesion assisting agent-bearing metal foil according to claim 1, wherein the component (B) is crosslinked rubber particles.

5. The adhesion assisting agent-bearing metal foil according to claim 1, wherein the component (B) is at least one substance selected from acrylonitrile-butadiene rubber particles, carboxylic acid-modified acrylonitrile-butadiene rubber particles, and butadiene rubber-acrylic resin core shell particles.

6. The adhesion assisting agent-bearing metal foil according to claim 1, wherein the component (B) is added in an amount of 0.5 to 20 parts by weight to the component (A) 100 parts by weight.

7. The adhesion assisting agent-bearing metal foil according to claim 1, wherein the component (C) is a novolak phenol resin.

8. The adhesion assisting agent-bearing metal foil according to claim 1, wherein the component (C) is a cresol novolak phenol resin having a triazine ring.

9. The adhesion assisting agent-bearing metal foil according to claim 8, wherein nitrogen content of the cresol novolak phenol resin having a triazine ring is 12 to 22% by weight.

10. The adhesion assisting agent-bearing metal foil according to claim 1, wherein the surface of the metal foil has a ten-point average roughness Rz 2.0 μm or less.

11. The adhesion assisting agent-bearing metal foil according to claim 1, wherein the surface of the metal foil is not subjected to roughening treatment for promotion of the adhesive strength.

12. The adhesion assisting agent-bearing metal foil according to claim 1, wherein the metal foil is a copper foil having been subjected to rust preventing treatment with at least one of zinc, chromium, and nickel on a surface on which is provided the adhesion assisting agent layer.

13. The adhesion assisting agent-bearing metal foil according to claim 1, wherein a surface of the metal foil on which is provided the adhesion assisting agent layer, has been subjected to silane coupling treatment with a silane coupling agent.

14. The adhesion assisting agent-bearing metal foil according to claim 13, wherein the silane coupling agent has an epoxy group or an amino group.

15. The adhesion assisting agent-bearing metal foil according to Claim 1, wherein the metal foil has a thickness of 5 μm or thinner and has a separable carrier.

16. A printed wiring board produced using the adhesion assisting agent-bearing metal foil according to claim 1 and having a peeling strength of 0.6 kN/m or higher at 20° C. between an insulating layer formed through the adhesion assisting agent layer of the adhesion assisting agent-bearing metal foil and a conductor circuit with 1 mm width formed using the metal foil of the adhesion assisting agent-bearing metal foil.

17. The printed wiring board according to claim 16, wherein the peeling strength is 0.4 kN/m or higher at 20° C. between the insulating layer and the conductor circuit after heating at 150° C. for 240 hours.

18. The adhesion assisting agent-bearing metal foil according to claim 1, wherein said thickness of said adhesion assisting agent layer is in a range of 0.1 to 5.0 μm.

19. The adhesion assisting agent-bearing metal foil according to claim 1, wherein the adhesion assisting agent layer contains 69 to 94% by weight of the epoxy resin, at least 0.5% by weight rubber particles, and 5 to 19% by weight epoxy resin curing agent, in the total weight of the components (A), (B) and (C).

* * * * *